(12) United States Patent
Son et al.

(10) Patent No.: US 11,721,255 B2
(45) Date of Patent: Aug. 8, 2023

(54) TILING DISPLAY DEVICE

(71) Applicant: Samsung Display Co., Ltd., Yongin-Si (KR)

(72) Inventors: Sunkwun Son, Suwon-si (KR); Dong Hee Shin, Asan-si (KR); Nahyeon Cha, Yongin-si (KR); Byoungsun Na, Seoul (KR); Joonhoo Choi, Seoul (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 4 days.

(21) Appl. No.: 17/473,708

(22) Filed: Sep. 13, 2021

(65) Prior Publication Data

US 2022/0084449 A1 Mar. 17, 2022

(30) Foreign Application Priority Data

Sep. 15, 2020 (KR) .................. 10-2020-0118369

(51) Int. Cl.
| | | |
|---|---|---|
| *G09G 3/00* | (2006.01) | |
| *G09G 3/32* | (2016.01) | |
| *H01L 27/15* | (2006.01) | |
| *H01L 33/50* | (2010.01) | |
| *H01L 33/58* | (2010.01) | |

(52) U.S. Cl.
CPC .............. *G09G 3/007* (2013.01); *G09G 3/32* (2013.01); *H01L 27/156* (2013.01); *H01L 33/502* (2013.01); *H01L 33/58* (2013.01); *G09G 2300/026* (2013.01); *G09G 2300/0452* (2013.01); *G09G 2310/0267* (2013.01); *G09G 2310/0275* (2013.01); *H01L 2933/0091* (2013.01)

(58) Field of Classification Search
CPC ........ G09G 3/007; G09G 3/32; H01L 27/156; H01L 33/502; H01L 33/58
USPC .................... 345/1.3, 87, 204, 440; 359/885
See application file for complete search history.

(56) References Cited

U.S. PATENT DOCUMENTS

| | | | |
|---|---|---|---|
| 2005/0078104 A1* | 4/2005 | Matthies | ............... H01L 25/167 345/204 |
| 2009/0021496 A1* | 1/2009 | Silzars | .................... G09F 13/22 345/204 |
| 2011/0057861 A1* | 3/2011 | Cok | ..................... H01L 51/5209 345/1.3 |
| 2016/0018569 A1* | 1/2016 | Zheng | .................. G02B 3/0087 359/885 |
| 2020/0163233 A1* | 5/2020 | Brackley | ............. H01L 25/0753 |
| 2021/0210141 A1* | 7/2021 | Seiler | ..................... G09G 5/395 |
| 2022/0052030 A1* | 2/2022 | Zhang | ..................... H01L 25/13 |
| 2022/0285431 A1* | 9/2022 | Garner | .................... H01L 33/62 |

FOREIGN PATENT DOCUMENTS

KR 10-0557733 B1 5/2006

* cited by examiner

*Primary Examiner* — Prabodh M Dharia
(74) *Attorney, Agent, or Firm* — Innovation Counsel LLP

(57) ABSTRACT

A tiling display device includes a first display panel and a second display panel that is spaced apart from the first display panel by a horizontal tiling interval. The first display panel includes first to (n)-th pixel columns, and the second display panel includes first to (m)-th pixel columns. A first distance between the (n)-th pixel column of the first display panel and the first pixel column of the second display panel is less than a second distance between a (n−1)-th pixel column of the first display panel and the (n)-th pixel column of the first display panel.

20 Claims, 13 Drawing Sheets

TILING DISPLAY DEVICE

CROSS-REFERENCE TO RELATED APPLICATION(S)

This application claims priority from and the benefit of Korean Patent Application No. 10-2020-0118369, filed on Sep. 15, 2020, the disclosure of which is hereby incorporated by reference in its entirety.

BACKGROUND

Field

The present disclosure relates generally to a display device. More specifically, the present disclosure relates to a tiling display device including an unrecognizable boundary area.

Discussion of the Background

A tiling display device has a structure in which a plurality of display panels are disposed adjacent to each other to provide a large screen. Each of the display panels displays a partial image, and the tiling display device may display a whole image in which the partial images of the display panels are combined.

A boundary area in which pixels are not disposed may be defined between the display panels. Since an image is not displayed in the boundary area, the boundary area may be easily recognizable by a viewer, and the view's perception toward the display quality of the tiling display device may be adversely affected.

The above information disclosed in this Background section is merely for understanding of the background of the inventive concepts, and, therefore, it may contain information that does not constitute a prior art.

SUMMARY

Some embodiments of the present disclosure provide a display device including an unrecognizable boundary area.

A tiling display device according to an embodiment may include a first display panel including a first set of pixel columns that extends in a vertical direction and is arranged in a horizontal direction, wherein the first set of pixel columns includes first to (n)-th (where n is an integer greater than 1) pixel columns, and a second display panel spaced apart from the first display panel by a horizontal tiling interval and including a second set of pixel columns that extends in the vertical direction and is arranged in the horizontal direction, wherein the second set of pixel columns includes first to (m)-th (where m is an integer greater than 1) pixel columns. The (n)-th pixel column of the first display panel may be adjacent to the second display panel, the first pixel column of the second display panel may be adjacent to the first display panel, and a first distance between the (n)-th pixel column of the first display panel and the first pixel column of the second display panel may be less than a second distance between a (n−1)-th pixel column of the first display panel and the (n)-th pixel column of the first display panel.

According to an embodiment, the (n)-th pixel column of the first display panel may be shifted in the horizontal direction toward the second display panel by half of the horizontal tiling interval.

According to an embodiment, the first pixel column of the second display panel may be shifted in the horizontal direction toward the first display panel by half of the horizontal tiling interval.

According to an embodiment, a third distance between adjacent ones of pixel columns among the first set of pixel columns that are arranged in a central area of the first display panel may be less than or equal to the first distance between the (n)-th pixel column of the first display panel and the first pixel column of the second display panel.

According to an embodiment, the second distance between the (n−1)-th pixel column and the (n)-th pixel column of the first display panel may be less than a fourth distance between the (n−1)-th pixel column and (n−2)-th pixel column of the first display panel.

According to an embodiment, the first display panel may be divided into a first central area, a first peripheral area adjacent to the second display panel, and a first intermediate area between the first central area and the first peripheral area, and the first distance between the (n)-th pixel column of the first display panel and the first pixel column of the second display panel may be less than a fifth distance between adjacent ones of pixel columns among the first set of pixel columns that are arranged in the first intermediate area of the first display panel.

According to an embodiment, a sixth distance between adjacent ones of pixel columns among the first set of pixel columns that are arranged in the first central area of the first display panel may be less than the fifth distance.

According to an embodiment, each of distances between adjacent ones of the first set of pixel columns of the first display panel may gradually decrease from the first intermediate area to the first central area.

According to an embodiment, each of distances between adjacent ones of the first set of pixel columns of the first display panel may gradually decrease from the first intermediate area to the first peripheral area.

According to an embodiment, the second display panel may be divided into a second central area, a second peripheral area adjacent to the first display panel, and a second intermediate area between the second central area and the second peripheral area, and the first distance between the (n)-th pixel column of the first display panel and the first pixel column of the second display panel may be less than a seventh distance between adjacent ones of pixel columns among the second set of pixel columns that are arranged in the second intermediate area.

According to an embodiment, an eighth distance between adjacent ones of pixel columns among the second set of pixel columns that are arranged in the second central area of the second display panel may be less than the seventh distance.

According to an embodiment, each of distances between adjacent ones of the second set of pixel columns of the second display panel may gradually decrease from the second intermediate area to the second central area.

According to an embodiment, each of distances between adjacent ones of the second set of pixel columns of the second display panel may gradually decrease from the second intermediate area to the second peripheral area.

According to an embodiment, the first display panel may further include a first data driver disposed on a side of the first display panel and providing a data voltage to the first set of pixel columns and a first gate driver disposed on the side of the first display panel and providing a gate signal to the first set of pixel columns.

According to an embodiment, the second display panel may further include a second data driver disposed on a side of the second display panel and providing a data voltage to the second set of pixel columns and a second gate driver disposed on the side of the second display panel and providing a gate signal to the second set of pixel columns.

A tiling display device according to another embodiment may include a first display panel including a first set of pixel rows that extends in a horizontal direction and is arranged in a vertical direction, wherein the first set of pixel rows includes first to (n)-th (where n is an integer greater than 1) pixel rows, and a second display panel spaced apart from the first display panel by a vertical tiling interval and including a second set of pixel rows that extends in the horizontal direction and is arranged in the vertical direction, wherein the second set of pixel rows includes first to (m)-th (where m is an integer greater than 1) pixel rows. The (n)-th pixel row of the first display panel may be adjacent to the second display panel, the first pixel row of the second display panel may be adjacent to the first display panel, and a first distance between the (n)-th pixel row of the first display panel and the first pixel row of the second display panel may be less than a second distance between a (n−1)-th pixel row of the first display panel and the (n)-th pixel row of the first display panel.

According to an embodiment, the (n)-th pixel row of the first display panel may be shifted in the vertical direction toward the second display panel by half of the vertical tiling interval.

According to an embodiment, the first pixel row of the second display panel may be shifted in the vertical direction toward the first display panel by half of the vertical tiling interval.

A tiling display device according to still another embodiment may include a first display panel including a plurality of first black matrix patterns, wherein each of the plurality of first black matrix patterns extends in a vertical direction and is arranged in a horizontal direction and a second display panel including a plurality of second black matrix patterns, wherein each of the plurality of second black matrix patterns extends in the vertical direction and is arranged in the horizontal direction. The first display panel may be divided into a central area and a peripheral area that is between the central area of the first display panel and the second display panel, and a first width of each of the plurality of first black matrix patterns in the peripheral area in the horizontal direction may be greater than a second width of each of the plurality of first black matrix patterns in the central area in the horizontal direction.

According to an embodiment, each of widths of the plurality of first black matrix patterns of the first display panel in the horizontal direction may gradually increase from the central area to the peripheral area.

According to one embodiment, a tiling display device may include a plurality of display panels, and each of the display panels may be divided into a central area, a peripheral area that is adjacent to a neighboring display panel, and an intermediate area between the central area and the peripheral area. Each of the display panels may include a plurality of pixel columns, and the pixel columns may be disposed to be shifted away from the intermediate area. Accordingly, the distance between the pixel columns adjacent to a boundary between the adjacent display panels may be reduced, and the boundary of the adjacent display panels may be visually unrecognizable.

It is to be understood that both the foregoing general description and the following detailed description are explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure, and together with the description serve to explain the inventive concepts.

DETAILED DESCRIPTION

Illustrative, non-limiting embodiments of the present disclosure will be more clearly understood from the following detailed description in conjunction with the accompanying drawings.

Figure 1:
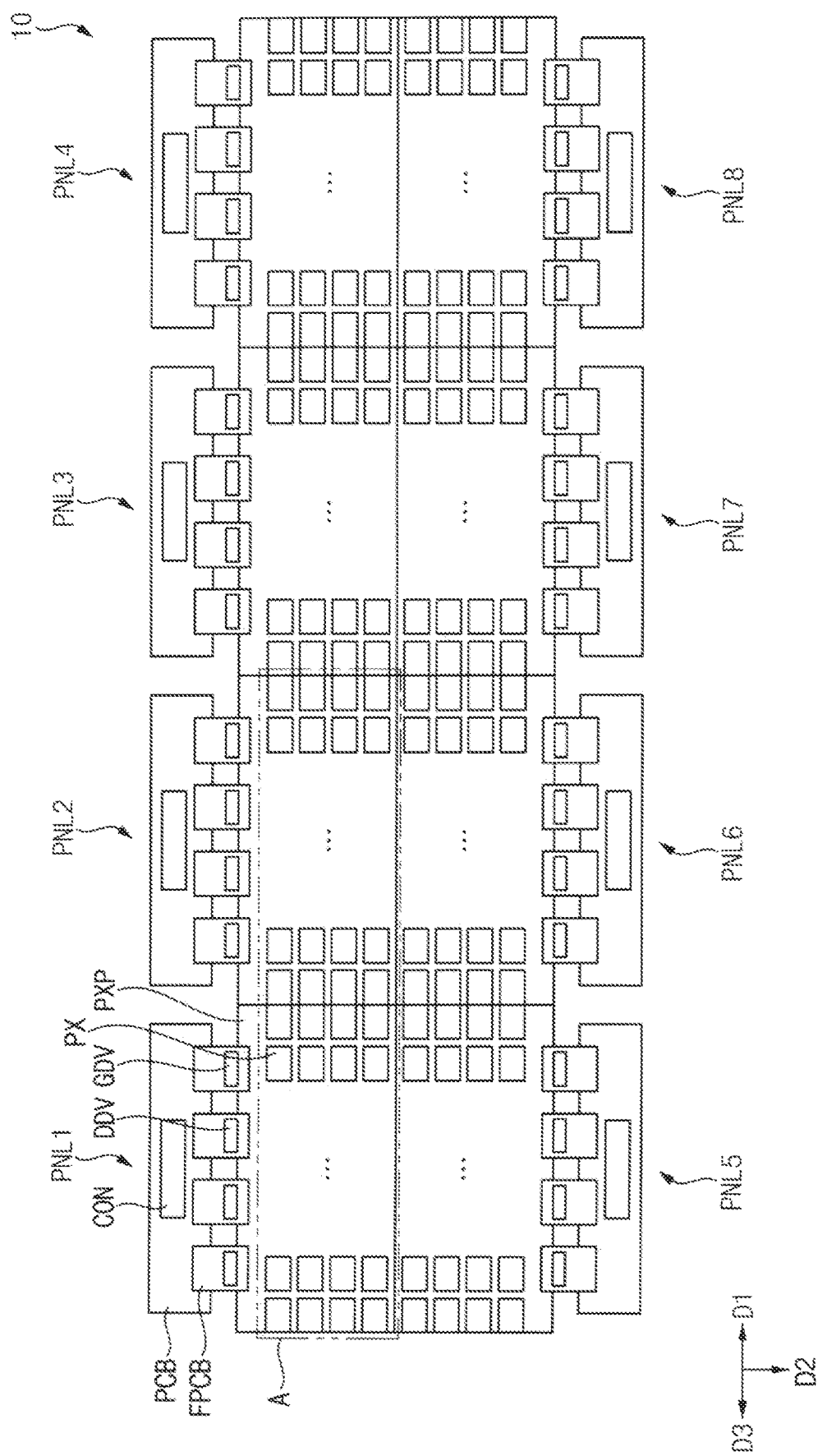
FIG. 1 is a plan view illustrating a tiling display device according to an embodiment.

FIG. 1 is a plan view illustrating a tiling display device according to an embodiment.

Referring to FIG. 1, a tiling display device 10 according to an embodiment of the present disclosure may include a plurality of display panels. The tiling display device 10 may include a first display panel PNL1, a second display panel PNL2, a third display panel PNL3, a fourth display panel PNL4, a fifth display panel PNL5, a sixth display panel PNL6, a seventh display panel PNL7, and an eighth display panel PNL8. The first to fourth display panels PNL1, PNL2, PNL3, and PNL4 may be arranged in a first row extending in a first direction D1, and the fifth to eighth display panels PNL5, PNL6, PNL7, and PNL8 may be arranged in a second row adjacent to the first row extending in the first direction D1. For example, the first direction D1 may refer to a horizontal direction, and a second direction D2 that is orthogonal to the first direction D2 may refer to a vertical direction.

The first to eighth display panels PNL1, PNL2, PNL3, PNL4, PNL5, PNL6, PNL7, and PNL8 may respectively display first to eighth images. A viewer may view a whole image in which the first to eighth images are combined.

The first display panel PNL1 may include a pixel portion PXP, at least one gate driver GDV, at least one data driver DDV, and a controller CON. In addition, the first to eighth display panels PNL1, PNL2, PNL3, PNL4, PNL5, PNL6, PNL7, and PNL8 may have substantially the same structure.

A plurality of pixels PX may be disposed in the pixel portion PXP. The pixels PX may be arranged in a matrix shape. In this case, the pixel portion PXP may include a plurality of pixel columns PXC that extends in the second direction D2 and is arranged in the first direction D1.

The gate driver GDV may generate a gate signal. The gate signal may be provided to the pixels PX, and one or more transistors included in each of the pixels PX may be turned on or off according to the gate signal. For example, the pixels PX may be sequentially turned on along the second direction D2. In an embodiment, the gate driver GDV may be implemented in the form of an integrated circuit (IC), and may be disposed on a flexible printed circuit board FPCB. The flexible printed circuit board FPCB may be disposed on one side of the first display panel PNL1.

The data driver DDV may generate a data voltage. The data voltage may be provided to the pixels PX, and the pixels PX may generate light having a specific luminance according to the data voltage. In an embodiment, the data driver DDV may be implemented in the form of an integrated circuit (IC), and may be disposed on a separate flexible printed circuit board FPCB. The separate flexible printed circuit board FPCB on which the data driver DDV is implemented and the flexible printed circuit board FPCB on which the gate driver GDV is implemented may be disposed on the same side of the first display panel PNL1. In one embodiment, the gate driver GDV and the data driver DDV may be integrated in the same IC or implemented in separate ICs but disposed on the same flexible printed circuit board FPCB.

As the gate driver GDV and the data driver DDV are disposed on the same side of the first display panel PNL1, a bezel of the first display panel PNL1 may be reduced. However, the arrangement of the gate driver GDV and the data driver DDV is not limited thereto.

The controller CON may control the gate driver GDV and the data driver DDV. For example, the controller CON may be disposed on a printed circuit board PCB that is connected to the flexible printed circuit board FPCB.

Figure 2:
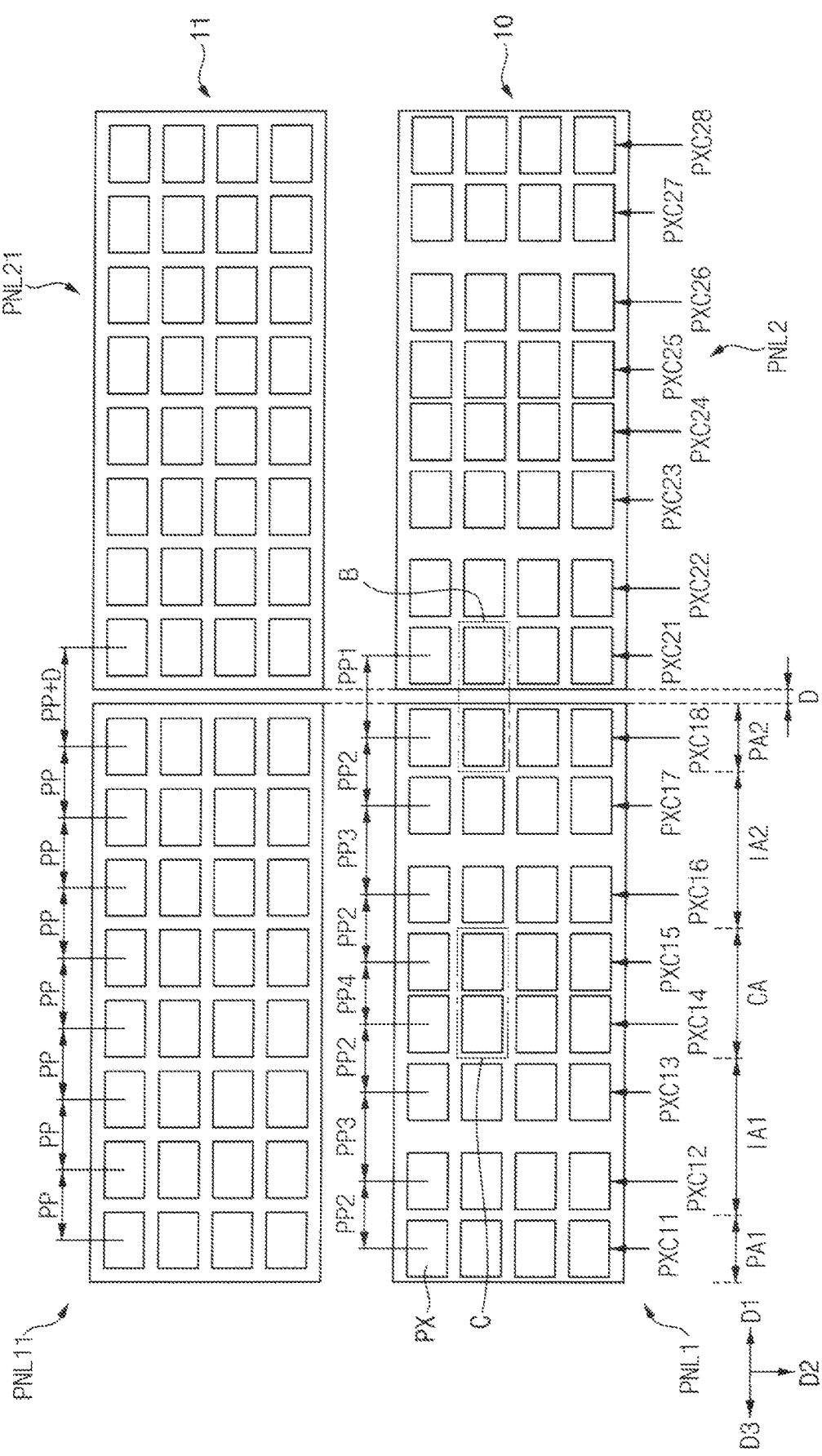
FIG. 2, FIG. 3, and FIG. 4 are enlarged views illustrating an arrangement structure of pixel columns according to the tiling display device of FIG. 1 and according to a comparative tiling display device.
Figure 3:
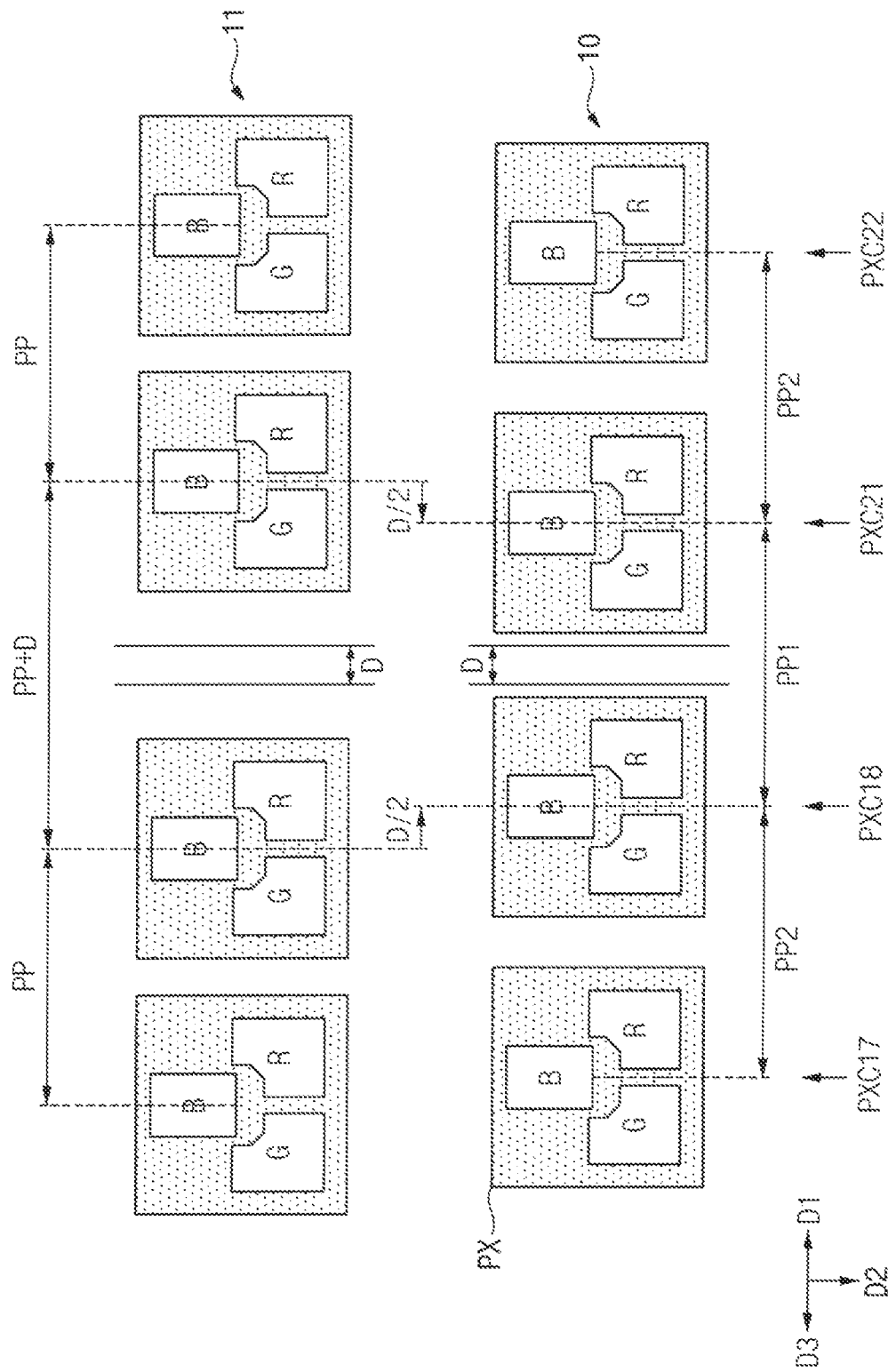
Figure 4:
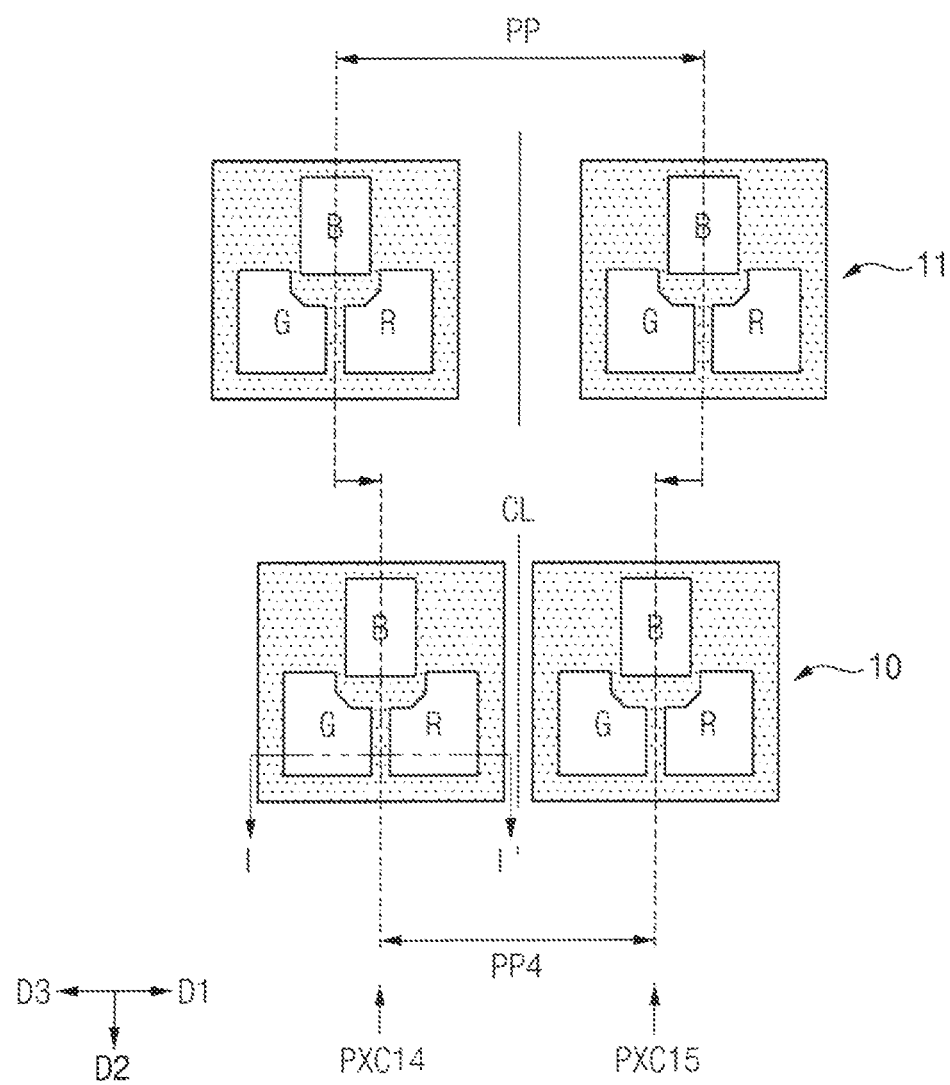
Figure 5A:
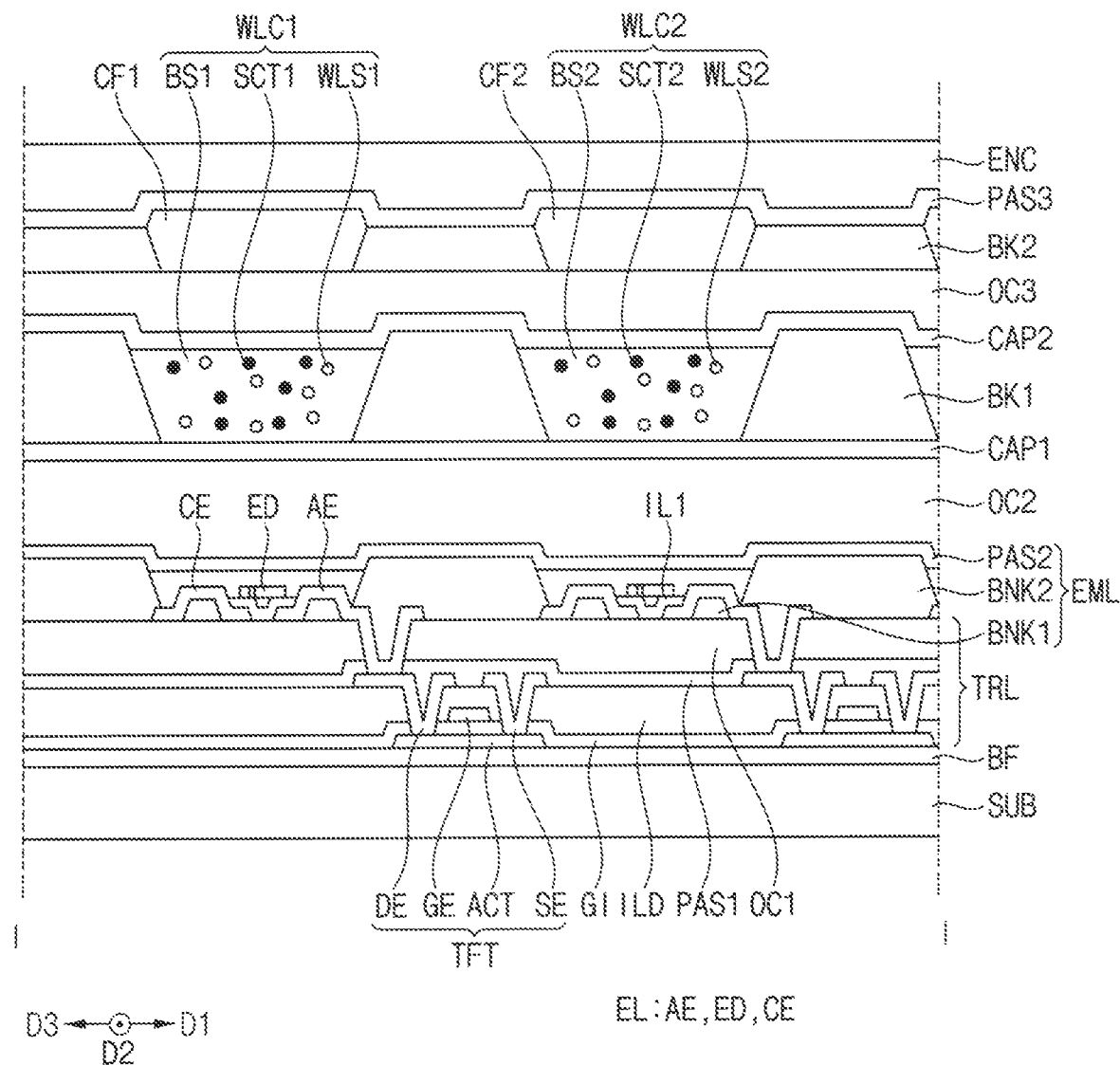
FIG. 5A is a cross-sectional view taken along line I-I' of FIG. 4.
Figure 5B:
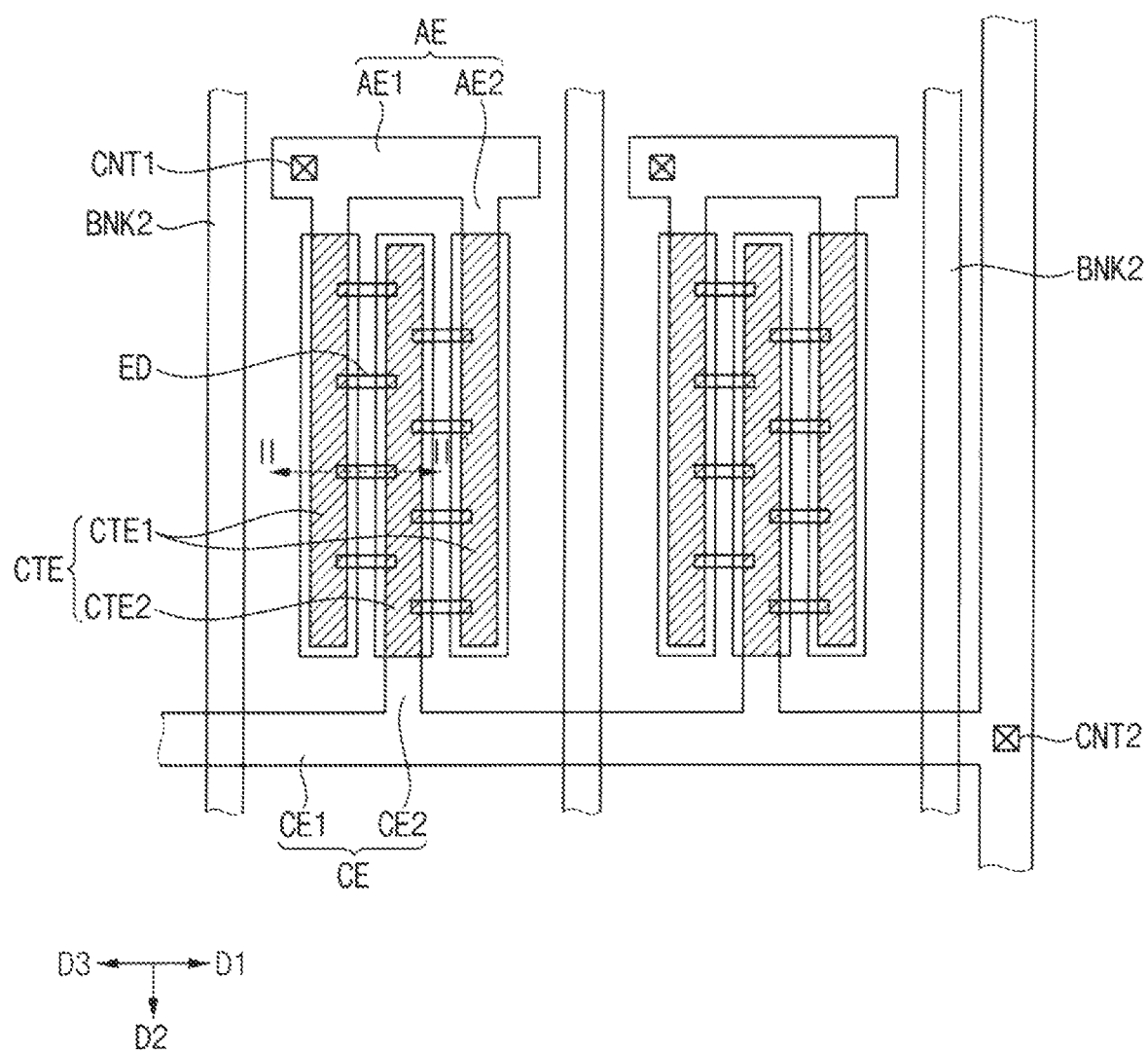
FIG. 5B is an enraged view illustrating sub-pixels included in the tiling display device of FIG. 1.
Figure 5C:
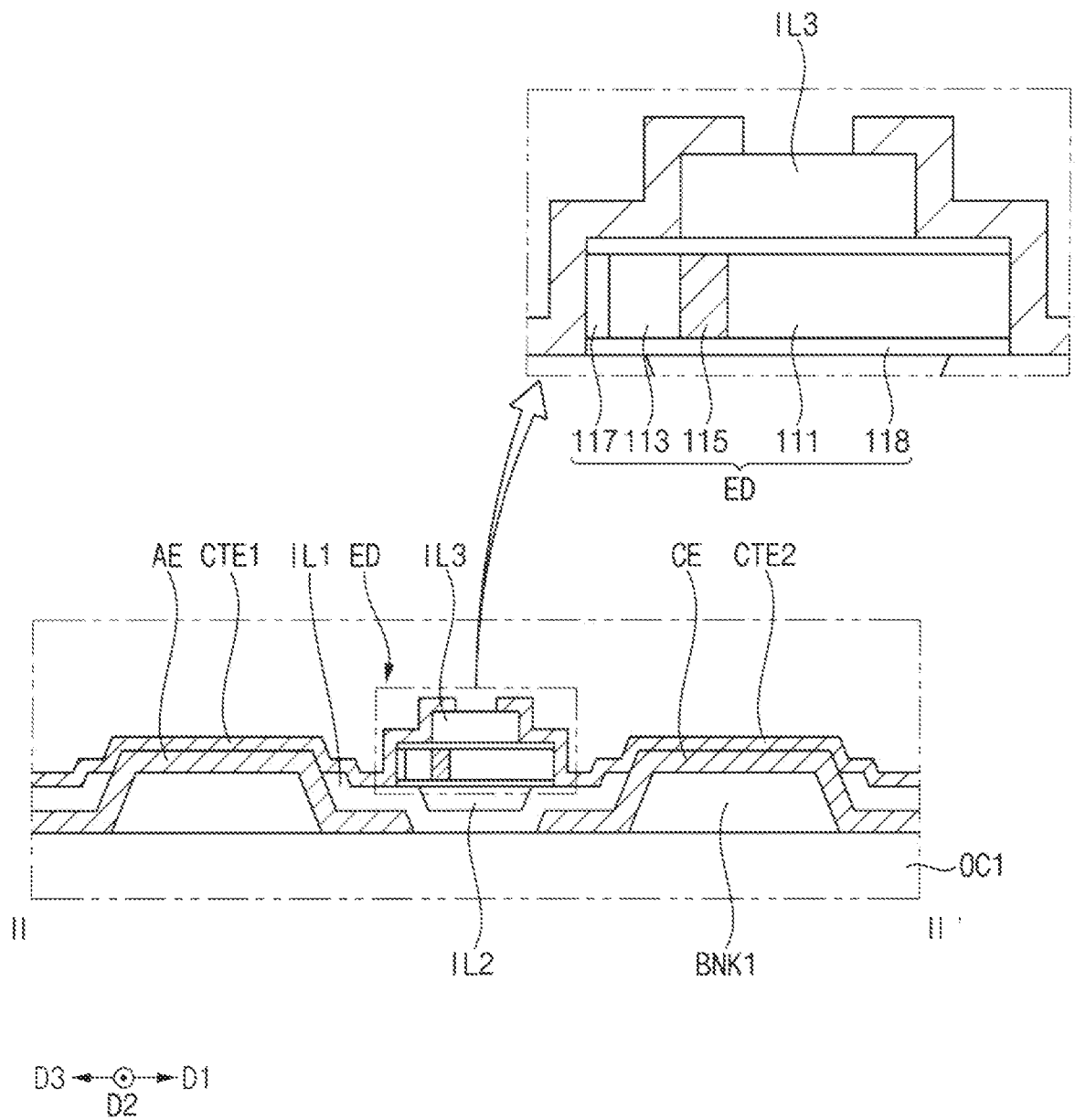
FIG. 5C is a cross-sectional view taken along line II-IF of FIG. 5B.

FIGS. 2, 3, and 4 are enlarged views illustrating an arrangement structure of the plurality of pixel columns PXC according to the tiling display device 10 of FIG. 1 and according to a comparative tiling display device. FIG. 5A is a cross-sectional view taken along line I-I' of FIG. 4. FIG. 5B is an enraged view illustrating sub-pixels included in the tiling display device 10 of FIG. 1. FIG. 5C is a cross-sectional view taken along line II-IF of FIG. 5B. For example, FIG. 2 may be an enlarged view of area A of FIG. 1, FIG. 3 may be an enlarged view of area B of FIG. 2, and FIG. 4 may be an enlarged view of area C of FIG. 2.

Referring to FIGS. 2, 3, and 4, the tiling display device 10 may include the first and second display panels PNL1 and PNL2. The pixels PX may be disposed in the first and second display panels PNL1 and PNL2. Each of the pixels PX may include a plurality of sub-pixels. For example, each of the pixels PX may include a blue sub-pixel B emitting blue light, a green sub-pixel G emitting green light, and a red sub-pixel R emitting red light. The sub-pixels may be arranged various shapes (e.g., a triangular shape) in each of the pixels PX. For example, the green sub-pixel and the red sub-pixel may be arranged adjacent to each other, and the blue sub-pixel may be arranged in a row above the green sub-pixel and the red sub-pixel and between the green sub-pixel and the red sub-pixel. The blue sub-pixel may have a substantially rectangular shape, while each of the green sub-pixel and the red sub-pixel may have a protruded portion toward the blue sub-pixel and the adjacent red or green sub-pixel. The second display panel PNL2 may have substantially the same structure as the first display panel PNL1, and may be spaced apart from the first display panel PNL1 by a horizontal tiling interval D in the first direction D1.

The first display panel PNL1 may be divided into a first peripheral area PA1, a first intermediate area IA1, a central area CA, a second intermediate area IA2, and a second peripheral area PA2. The central area CA may be an area located in the center of the first display panel PNL1, and the second peripheral area PA2 may be adjacent to the second display panel PNL2, and the second intermediate area IA2 may be located between the central area CA and the second peripheral area PA2. The first display panel PNL1 may have a structure symmetrical with respect to the central area CA.

In an embodiment, the first display panel PNL1 may include a first pixel column PXC11, a second pixel column PXC12, a third pixel column PXC13, a fourth pixel column PXC14, a fifth pixel column PXC15, a sixth pixel column PXC16, a seventh PXC17, and an eight pixel column PXC18 that extend in the second direction D2 and are arranged in the first direction D1. For example, the first pixel column PXC11 may be arranged in the first peripheral area PA1, the second and third pixel columns PXC12 and PXC13 may be arranged in the first intermediate area IA1, the fourth and fifth pixel columns PXC14 and PXC15 may be arranged in the central area CA, the sixth and seventh pixel columns PXC16 and PXC17 may be arranged in the second intermediate area IA2, and the eighth pixel column PXC18 may be arranged in the second peripheral area PA2. Accordingly, the eighth pixel column PXC18 may be adjacent to the second display panel PNL2. In addition, the first pixel column PXC21 of the second display panel PNL2 may be adjacent to the first display panel PNL1.

A comparative tiling display device 11 according to a comparative embodiment includes first and second display panels PNL11 and PNL12, and the first display panel PNL11 includes a plurality of pixel columns PXC. In the comparative tiling display device 11, a pixel distance PP measured between centers of adjacent pixel columns PXC that are arranged in the first display panel PNL11 may be constant. In addition, the distance between a center of the eighth pixel column of the first display panel PNL11 and a center of the first pixel column of the second display panel PNL21 may be equal to a sum of the pixel distance PP and the horizontal tiling interval D.

On the other hand, in the tiling display device 10, the pixel distances between centers of adjacent ones of the first to eighth pixel columns PXC11, PXC12, PXC13, PXC14, PXC15, PXC16, PXC17, and PXC18 arranged in the first display panel PNL1 may be different from each other. Hereinafter, a pixel distance (or a distance in short) between adjacent pixel columns PXC refers to a distance that is measured between a center of one pixel column to a center of an adjacent pixel column unless it is explicitly defined otherwise.

In an embodiment, as shown in FIG. 3, the eighth pixel column PXC18 of the first display panel PNL1 may be shifted toward the second display panel PNL2 in the first direction D1. In addition, the first pixel column PXC21 of the second display panel PNL2 may be shifted toward the first display panel PNL1 in a third direction D3 that is opposite to the first direction D1.

In an embodiment, the eighth pixel column PXC18 of the first display panel PNL1 may be shifted toward the second display panel PNL2 in the first direction D1 by half of the horizontal tiling interval D. In addition, the first pixel column PXC21 of the second display panel PNL2 may be shifted toward the first display panel PNL1 in the third direction D3 by half of the horizontal tiling interval D. Accordingly, a first distance PP1 between the eighth pixel column PXC18 of the first display panel PNL1 and the first pixel column PXC21 of the second display panel PNL2 may be equal to the pixel distance PP.

In an embodiment, distances between the first to fourth pixel columns PXC11, PXC12, PXC13, and PXC14 of the first display panel PNL1 may gradually decrease from the first intermediate area IA1 to the central area CA, and distances between the fifth to eighth pixel columns PXC15, PXC16, PXC17, and PXC18 of the first display panel PNL1 may gradually decrease from the second intermediate area IA2 to the central area CA. In addition, distances between the first to fourth pixel columns PXC11, PXC12, PXC13, and PXC14 of the first display panel PNL1 may gradually decrease from the first intermediate area IA1 to the first peripheral area PA1, and the distances between the fifth to eighth pixel columns PXC15, PXC16, PXC17, and PXC18 of the first display panel PNL1 may gradually decrease from the second intermediate area IA2 to the second peripheral area PA2. In other words, the first to fourth pixel columns PXC11, PXC12, PXC13, and PXC14 of the first display panel PNL1 may be arranged to be shifted away from a center of the first intermediate region IA1, and the fifth to eighth pixel columns PXC15 and PXC16, PXC17, PXC18 of the first display panel PNL1 may be arranged to be shifted away from a center of the second intermediate region IA2. In addition, as shown in FIG. 4, the fourth and fifth pixel columns PXC14 and PXC15 of the first display panel PNL1 may be shifted toward a central line CL of the first display panel PNL1.

In addition, a second distance PP2 between the seventh pixel column PXC17 and the eighth pixel column PXC18 of the first display panel PNL1 may be greater than the first distance PP1. In addition, a third distance PP3 between the sixth pixel column PXC16 and the seventh pixel column PXC17 of the first display panel PNL1 may be greater than the second distance PP2. A distance between the fifth pixel column PXC15 and the sixth pixel column PXC16 may be the same as the second distance PP2. A fourth distance PP4 between the fourth pixel column PXC14 and the fifth pixel column PXC15 may be less than the second distance PP2. In addition, the fourth distance PP4 may be less than or equal to the first distance PP1.

In an embodiment, the difference between each of the first to fourth distances PP1, PP2, PP3, and PP4 and the pixel distance PP may be less than half of the pixel distance PP. For example, the first distance PP1 may be the same as the pixel distance PP. The second distance PP2 may be less than the pixel distance PP, and a difference between the second distance PP2 and the pixel distance PP may be less than half of the pixel distance PP. The third distance PP3 may be greater than the pixel distance PP, and a difference between the third distance PP3 and the pixel distance PP may be less than half of the pixel distance PP. The fourth distance PP4 may be less than the pixel distance PP, and a difference between the fourth distance PP4 and the pixel distance PP may be less than half of the pixel distance PP.

The tiling display device 10 may include a plurality of display panels (e.g., the first to eighth display panels PNL1 to PNL8), and each of the display panels may be divided into a central area CA (see FIG. 2), a peripheral area PA (e.g., PA1 or PA2; see FIG. 2) adjacent to a neighboring display panel in the first direction D1, and an intermediate area (e.g., IA1 or IA2; see FIG. 2) between the central area CA and the peripheral area PA. Each of the display panels may include a plurality of pixel columns, and the pixel columns may be disposed to be shifted away from a center of the intermediate area. Accordingly, the distance between the pixel columns adjacent to a boundary area between adjacent ones of the display panels may be reduced, and the boundary area of the display panels may be visually unrecognizable.

Referring to FIG. 5A, a substrate SUB may include a transparent or an opaque material. For example, the substrate SUB may include glass, quartz, plastic, or the like.

A buffer layer BF may be disposed on the substrate SUB. The buffer layer BF may be formed of an inorganic film capable of preventing penetration of air or moisture.

A transistor layer TRL may be disposed on the substrate SUB. At least one transistor TFT may be formed in the transistor layer TRL. The transistors TFT formed in the transistor layer TRL may include a switching transistor that is turned on in response to the gate signal, a driving transistor that generates a driving current based on the data voltage, and a light emitting transistor that transfers the driving current to a light emitting element.

A semiconductor layer ACT may be disposed on the buffer layer BF, and a gate insulating layer GI may be disposed on the semiconductor layer ACT and the buffer layer BF. The semiconductor layer ACT may overlap a gate electrode GE, a source electrode SE, and a drain electrode DE. The semiconductor layer ACT may directly contact the source electrode SE and the drain electrode DE, and may face the gate electrode GE with the gate insulating layer GI interposed therebetween. The TFT may include the semiconductor layer ACT, the gate electrode GE, the source electrode SE, and the drain electrode DE.

The gate electrode GE may be disposed on the gate insulating layer GI. The gate electrode GE may overlap the semiconductor layer ACT with the gate insulating layer GI interposed therebetween.

An interlayer insulating layer ILD may be disposed on the gate insulating layer GI and the gate electrode GE. The source electrode SE and the drain electrode DE may be disposed to be spaced apart from each other on the interlayer insulating layer ILD. The source electrode SE may contact one end of the semiconductor layer ACT through a contact hole that penetrates through the gate insulating layer GI and the interlayer insulating layer ILD. The drain electrode DE may contact the other end of the semiconductor layer ACT through another contact hole that penetrates through the gate insulating layer GI and the interlayer insulating layer ILD. The drain electrode DE may be connected to a first electrode AE of a light emitting member EL through a contact hole that penetrates through a first passivation layer PAS1 and a first planarization layer OC1 that are disposed on the interlayer insulating layer ILD.

The gate insulating layer GI that is disposed on the semiconductor layer ACT and the buffer layer BF may provide insulation between semiconductor layer ACT and the gate electrode GE. The gate insulating layer GI may include a contact hole through which the source electrode SE passes and another contact hole through which the drain electrode DE passes.

The interlayer insulating layer ILD that is disposed on the gate electrode GE may include a contact hole through which the source electrode SE passes and another contact hole through which the drain electrode DE passes.

The first passivation layer PAS1 may be disposed on the transistor TFT and may protect the transistor TFT. For example, the first passivation layer PAS1 may include a contact hole through which the first electrode AE passes.

The first planarization layer OC1 may be disposed on the first passivation layer PAS1 and may planarize an upper surface of the transistor TFT. For example, the first planarization layer OC1 may include a contact hole through which the first electrode AE of the light emitting member EL passes.

A light emitting diode layer EML may include the light emitting member EL, a first bank BNK1, a second bank BNK2, and a second passivation layer PAS2.

The light emitting member EL may be disposed on the transistor TFT. The light emitting member EL may include the first electrode AE, a second electrode CE, and a light emitting diode ED.

The first electrode AE may be disposed on the first planarization layer OC1. For example, the first electrode AE may be disposed on one first bank BNK1 that is disposed on the first planarization layer OC1 and may cover the first bank BNK1. The first electrode AE may be connected to the drain electrode DE of the transistor TFT.

The second electrode CE may be disposed on the first planarization layer OC1. For example, the second electrode CE may be disposed on an adjacent first bank BNK1 that is disposed on the first planarization layer OC1 adjacent to the first bank BNK1 on which the first electrode AE is disposed, and may cover the first bank BNK1. The second electrode CE may receive a common voltage supplied to the plurality of pixels PX.

A first insulating layer IL1 may cover a portion of the first electrode AE and a portion of the second electrode CE that are adjacent to each other, and may insulate between the first electrode AE and the second electrode CE.

The light emitting diode ED may be disposed between the first electrode AE and the second electrode CE on the first insulating layer ILL One end of the light emitting diode ED may be connected to the first electrode AE, and the other end of the light emitting diode ED may be connected to the second electrode CE. For example, each of the light emitting diode ED of the plurality of pixels PX may include an active layer having the same material and may emit light of the same wavelength band or light of the same color. For example, the light emitting diode ED may emit blue light having a peak wavelength in the range of about 440 nm to about 480 nm.

The second bank BNK2 may be disposed on the first planarization layer OC1 to define a light emitting area. For example, the second bank BNK2 may surround the light emission area, but the present disclosure is not limited thereto.

The second passivation layer PAS2 may be disposed on the light emitting member EL and the second bank BNK2. The second protective layer PAS2 may cover the light emitting member EL and may protect the light emitting member EL.

A second planarization layer OC2 may be disposed on the light emitting diode layer EML to planarize an upper surface of the light emitting diode layer EML. The second planarization layer OC2 may include an organic material.

A first capping layer CAP1 may be disposed on the second planarization layer OC2. The first capping layer CAP1 may seal lower surfaces of a first wavelength converter WLC1 and a second wavelength converter WLC2 that are disposed on the first capping layer CAP1. The first capping layer CAP1 may include an inorganic material.

A first light blocking member BK1 may be disposed on the first capping layer CAP1. The first light blocking member BK1 may overlap the second bank BNK2 in a thickness direction of the tiling display device 10. The first light blocking member BK1 may block light. The first light blocking member BK1 may include an organic light blocking material and a liquid repellent component.

The first wavelength converter WLC1 may be disposed on the first capping layer CAP1. The first wavelength converter WLC1 may overlap a corresponding one of the light emitting diodes ED. The first wavelength converter WLC1 may be surrounded by the first light blocking member BK1. The first wavelength converter WLC1 may include a first base resin BS1, a first scattering body SCT1, and a first wavelength shifter WLS1.

The first base resin BS1 may include a material having a relatively high light transmittance. The first base resin BS1 may be made of a transparent organic material. For example, the first base resin BS1 may include at least one of organic materials such as an epoxy resin, an acrylic resin, a cardo resin, and an imide resin.

The first scattering body SCT1 may have a refractive index that is different from a refractive index of the first base resin BS1, and may form an optical interface with the first base resin BS1. For example, the first scattering body SCT1 may include a light scattering material or light scattering particles that scatter at least a portion of the transmitted light.

The first wavelength shifter WLS1 may convert or shift a peak wavelength of incident light to a first peak wavelength. For example, the first wavelength shifter WLS1 may convert blue light into green light having a peak wavelength in the range of about 510 nm to about 550 nm. In one embodiment, the first wavelength shifter WLS1 may be a quantum dot, a quantum rod, a phosphor, or any combination thereof. The quantum dot may be a particulate material that emits a specific color while electrons transition from a conduction band to a valence band.

The light emitted by the first wavelength shifter WLS1 may have a full width (e.g., full width of half maximum, FWHM) of an emission wavelength spectrum of about 45 nm or less, or about 40 nm or less, or about 30 nm or less. Accordingly, color reproducibility of the tiling display device 10 may be improved.

Some of the blue light emitted from the light emitting diode layer EML may pass through the first wavelength converter WLC1 without being converted into green light by the first wavelength shifter WLS1. Among the blue light emitted from the light emitting diode layer EML, the light that is not converted by the first wavelength converter WLC1 and incident on a first color filter CF1 may be filtered by the first color filter CF1. In addition, the green light converted by the first wavelength converter WLC1 may pass through the first color filter CF1 and be emitted to the outside.

The second wavelength converter WLC2 may be disposed on the first capping layer CAP1 adjacent to the first wavelength converter WLC1. The second wavelength converter WLC2 may overlap a corresponding one of the light emitting diodes ED. The second wavelength converter WLC2 may be surrounded by the first light blocking member BK1. The second wavelength converter WLC2 may include a second base resin BS2, a second scattering body SCT2, and a second wavelength shifter WLS2.

The second base resin BS2 may include a material having a relatively high light transmittance. The second base resin BS2 may be made of a transparent organic material. For example, the second base resin BS2 may include at least one of organic materials such as an epoxy resin, an acrylic resin, a cardo resin, and an imide resin.

The second scattering body SCT2 may have a refractive index that is different from a refractive index of the second base resin BS2, and may form an optical interface with the second base resin BS2. For example, the second scattering body SCT2 may include a light scattering material or light scattering particles that scatter at least a portion of the transmitted light.

The second wavelength shifter WLS2 may convert or shift the peak wavelength of incident light into a second peak wavelength that is different from the first peak wavelength of the first wavelength shifter WLS1. For example, the second wavelength shifter WLS2 may convert blue light into red light having a peak wavelength in the range of about 610 nm to 650 nm. In one embodiment, the second wavelength shifter WLS2 may be a quantum dot, a quantum rod, a phosphor, or any combination thereof. The second wavelength shifter WLS2 may include a material having the same effect as the material of the first wavelength shifter WLS1.

Although not shown in FIG. 5A, a light transmitting part may be further disposed on the first capping layer CAP1. The light transmitting part may overlap a corresponding one of the light emitting diodes ED. The light transmitting part may be surrounded by the first light blocking member BK1. The light transmitting part may transmit the incident light by maintaining its peak wavelength. The light transmitting part may include a third base resin and a third scattering body.

The third base resin may include a material having a relatively high light transmittance. The third base resin may be made of a transparent organic material.

The third scattering body may have a refractive index that is different from a refractive index of the third base resin, and may form an optical interface with the third base resin. For example, the third scattering body may include a light scattering material or light scattering particles that scatter at least a portion of the transmitted light.

The first and second wavelength converters WLC1 and WLC2 and the light transmitting part may be disposed on the light emitting diode layer EML with the second planarization layer OC2 and the first capping layer CAP1 interposed therebetween. Accordingly, the tiling display device 10 may not require a separate substrate for the first and second wavelength converters WLC1 and WLC2 and the light transmitting part.

The second capping layer CAP2 may cover the first and second wavelength converters WLC1 and WLC2, the light transmitting part, and the first light blocking member BK1.

The third planarization layer OC3 may be disposed on the second capping layer CAP2 to planarize upper surfaces of the first and second wavelength converters WLC1 and WLC2 and the light transmitting part. The third planarization layer OC3 may include an organic material.

The second light blocking member BK2 may be disposed on the third planarization layer OC3. The second light blocking member BK2 may overlap the first light blocking member BK1 or the second bank BNK2 in the thickness direction of the filing display device 10. The second light blocking member BK2 may block light.

The first color filter CF1 may be disposed on the third planarization layer OC3. The first color filter CF1 may be surrounded by the second light blocking member BK2. The first color filter CF1 may overlap the first wavelength converter WLC1 in the thickness direction of the filing display device 10. The first color filter CF1 may selectively transmit light of a first color (e.g., green light), and may block or absorb light of the second color (e.g., red light) and light of a third color (e.g., blue light).

A second color filter CF2 may be disposed on the third planarization layer OC3. The second color filter CF2 may be surrounded by the second light blocking member BK2. The second color filter CF2 may overlap the second wavelength converter WLC2 in the thickness direction of the filing display device 10. The second color filter CF2 may selectively transmit light of the second color (e.g., red light), and may block or absorb light of the first color (e.g., green light) and light of the third color (e.g., blue light).

Although it is not shown in FIG. 5A, a third color filter may be disposed on the third planarization layer OC3. The third color filter may be surrounded by the second light blocking member BK2. The third color filter may overlap the light transmitting part in the thickness direction of the filing display device 10. The third color filter may selectively transmit light of the third color (e.g., blue light), and may block or absorb light of the first color (e.g., green light) and light of the second color (e.g., red light).

A third passivation layer PAS3 may cover the first color filter CF1, the second color filter CF2, and the third color filter. The third passivation layer PAS3 may protect the first color filter CF1, the second color filter CF2, and the third color filter.

An encapsulation layer ENC may be disposed on the third passivation layer PAS3. For example, the encapsulation layer ENC may include at least one inorganic layer to prevent penetration of oxygen or moisture. In addition, the encapsulation layer ENC may include at least one organic layer.

Referring to FIG. 5B, each of the plurality of pixels PX may include first to third sub-pixels. For example, FIG. 5B may be an enlarged view illustrating the first and second sub-pixels, and the third sub-pixel may be substantially the same as the structures of the first and second sub-pixels.

The first to third sub-pixels may emit light of the same color. For example, the first to third sub-pixels may include the same type of light emitting diode ED, and may emit light of a third color or blue light. In another example, the first sub-pixel may emit light of a first color or green light, the second sub-pixel may emit light of a second color or red light, and the third sub-pixel may emit light of a third color or blue light.

The first and second electrodes AE and CE may be electrically connected to the light emitting diode ED to receive a predetermined voltage, and the light emitting diode ED may emit light of a specific wavelength range. At least some of the first and second electrodes AE and CE may form an electric field, and the light emitting diode ED may be aligned by the electric field.

For example, the first electrode AE may correspond to a pixel electrode that is separated for each of the first to third sub-pixels, and the second electrode CE may correspond to a common electrode that is connected to the first to third sub-pixels. One of the first electrode AE and the second electrode CE may correspond to an anode electrode of the light emitting diode ED, and the other may correspond to a cathode electrode of the light emitting diode ED.

The first electrode AE may include a first electrode stem part AE1 that extends in the first direction D1 and at least one first electrode branch AE2 that is branched from the first electrode stem part AE1 and extends in the second direction D2.

The first electrode stem part AE1 of one sub-pixel may be spaced apart from the first electrode stem part AE1 of an adjacent sub-pixel, and the first electrode stem parts AE1 of the adjacent sub-pixels may be disposed along a virtual extension line that extends in the first direction D1. The first electrode stem parts AE1 of the sub-pixels may receive different signals and may be independently driven.

The first electrode branch AE2 may be branched from the first electrode stem part AE1 and may extend in the second direction D2. One end of the first electrode branch AE2 may be connected to the first electrode stem part AE1.

The second electrode CE may include a second electrode stem part CE1 that extends in the first direction D1 and a second electrode branch CE2 that is branched from the second electrode stem part CE1 and extends in the second direction D2. The second electrode stem part CE1 may be connected to the second electrode stem part CE1 of an adjacent sub-pixel. The second electrode stem part CE1 may extend in the first direction D1.

The second electrode branch CE2 of the second electrode CE may be disposed to be spaced apart from and face the first electrode branch AE2 of the first electrode AE. One end of the second electrode branch CE2 may be connected to the second electrode stem part CE1, and the other end of the second electrode branch CE2 may be spaced apart from the first electrode stem part AE1.

The first electrode AE may be electrically connected to the transistor layer TRL through a first contact hole CNT1, and the second electrode CE may be connected to the transistor layer TRL through a second contact hole CNT2. For example, the first contact hole CNT1 may be disposed in the first electrode stem part AE1, and the second contact hole CNT2 may be disposed in the second electrode stem part CE1, but the present disclosure is not limited thereto.

The second bank BNK2 may be disposed between adjacent ones of the plurality of sub-pixels. The first electrode stem part AE1 may be spaced apart from each other by the second bank BNK2. The second bank BNK2 may extend in the second direction D2.

The light emitting diode ED may be disposed between the first electrode AE and the second electrode CE. One end of the light emitting diode ED may be connected to the first electrode AE, and the other end of the light emitting diode ED may be connected to the second electrode CE.

The plurality of light emitting diodes ED may include an active layer having the same material and may emit light of the same wavelength band or light of the same color. The first to third sub-pixels may emit light of the same color. For example, the plurality of light emitting diodes ED may emit light of a third color or blue light having a peak wavelength in the range of about 440 nm to about 480 nm.

A contact electrode CTE may include a contact electrode CTE1 and a second contact electrode CTE2. The first contact electrode CTE1 may cover a part of the first electrode branch AE2 and the light emitting diode ED, and electrically connect the first electrode branch AE2 and the light emitting diode ED. The second contact electrode CTE2 may cover a part of the second electrode branch CE2 and the light emitting diode ED, and may electrically connect the second electrode branch CE2 and the light emitting diode ED.

The first contact electrode CTE1 may be disposed on the first electrode branch AE2 to extend in the second direction D2. The first contact electrode CTE1 may contact one end of the light emitting diode ED. The light emitting diode ED may be electrically connected to the first electrode AE through the first contact electrode CTE1.

The second contact electrode CTE2 may be disposed on the second electrode branch CE2 to extend in the second direction D2. The second contact electrode CTE2 may be spaced apart from the first contact electrode CTE1 in the first direction D1. The second contact electrode CTE2 may contact the other end of the light emitting diode ED that is opposite to the end of the light emitting diode ED that the first contact electrode CTE1 contacts. The light emitting diode ED may be electrically connected to the second electrode CE through the second contact electrode CTE2.

Referring to FIG. 5C, the light emitting diode layer EML shown in FIG. 5A may be disposed on the transistor layer TRL that includes the first planarization layer OC1.

Each of the first and second electrodes AE and CE of the light emitting member EL may be disposed on a corresponding first bank BNK1.

The first banks BNK1 may be disposed on the first planarization layer OC1, and a side surface of the first banks BNK1 may be inclined in a cross-sectional view. The inclined side surface of the first banks BNK1 may reflect light emitted from the light emitting diode ED.

The first and second electrodes AE and CE may include a transparent conductive material. Each of the first and second electrodes AE and CE may include a conductive material having high reflectivity. For example, each of the first and second electrodes AE and CE may have a structure in which one or more layers of a transparent conductive material and a metal having a high reflectivity are stacked, or may be formed as a single layer including one of the transparent conductive material and the metal.

The first insulating layer IL1 may be disposed on the first planarization layer OC1, the first electrode AE, and the second electrode CE. The first insulating layer IL1 may cover a portion of each of the first and second electrodes AE and CE in a region between the first and second electrodes AE and CE.

The first insulating layer IL1 may protect the first and second electrodes AE and CE, and may insulate the first and second electrodes AE and CE from each other. The first insulating layer IL1 may also prevent the light emitting diode ED from being damaged by direct contact with other elements and/or layers.

A second insulating layer IL2 may be disposed on the first insulating layer IL1 in the region between the first and second electrodes AE and CE. The light emitting diode ED may be disposed between the first electrode AE and the second electrode CE on the first and second insulating layers IL1 and IL2. One end of the light emitting diode ED may be connected to the first electrode AE through the first contact electrode CTE1, and the other end of the light emitting diode ED may be connected to the second electrode CE through the second contact electrode CTE2.

The light emitting diode ED may have a shape extending in one direction. For example, the light emitting diode ED may have a shape such as a rod, a wire, or a tube. The light emitting diode ED may include a first semiconductor layer 111, a second semiconductor layer 113, an active layer 115, an electrode layer 117, and an insulating layer 118.

The first semiconductor layer 111 may be an n-type semiconductor. The first semiconductor layer 111 and the second semiconductor layer 113 may be disposed on the insulating layer 118. Each of the first and second semiconductor layers 111 and 113 may be formed of a single layer, but the present disclosure is not limited thereto.

The active layer 115 may be disposed between the first and second semiconductor layers 111 and 113. The active layer 115 may include a material having a single or multiple quantum well structure. When the active layer 115 includes a material having a multi-quantum well structure, a quantum layer and a well layer may be alternately stacked with each other.

Light emitted from the active layer 115 may be emitted in a longitudinal direction of the light emitting diode ED, and may also be emitted from both sides. The direction of light emitted from the active layer 115 may not be limited to a particular direction.

The electrode layer 117 may be an ohmic contact electrode. Alternatively, the electrode layer 117 may be a Schottky contact electrode. The light emitting diode ED may include at least one electrode layer 117.

The insulating layer 118 may surround the outer surface of the active layer 115 and may extend in a direction in which the light emitting diode ED extends. The insulating layer 118 may protect the light emitting diode ED.

The insulating layer 118 may include an insulating material (e.g., silicon oxide ($SiO_x$), silicon nitride ($SiN_x$), silicon oxynitride ($SiO_xN_y$), aluminum nitride (AlN), aluminum oxide ($Al_xO_y$), etc.).

The outer surface of the insulating layer 118 may be surface-treated. While the tiling display device 10 is manufactured, the light emitting diode ED may be sprayed onto an electrode in a state dispersed in a predetermined ink to be aligned.

A third insulating layer IL3 may be partially disposed on the light emitting diode ED between the first and second electrodes AE and CE. The third insulating layer IL3 may partially surround the outer surface of the light emitting diode ED. The third insulating layer IL3 may protect the light emitting diode ED.

The first contact electrode CTE1 may cover a part of the first electrode branch AE2 and the light emitting diode ED, and electrically connect the first electrode branch AE2 and the light emitting diode ED. The second contact electrode CTE2 may cover a part of the second electrode branch CE2 and the light emitting diode ED, and may connect the second electrode branch CE2 and the light emitting diode ED.

The first contact electrode CTE1 may be disposed on the first electrode branch AE2 to extend in the second direction D2. The first contact electrode CTE1 may contact one end of the light emitting diode ED. The light emitting diode ED may be electrically connected to the first electrode AE through the first contact electrode CTE1.

The second contact electrode CTE2 may be disposed on the second electrode branch CE2 to extend in the second direction D2. The second contact electrode CTE2 may be spaced apart from the first contact electrode CTE1 in the first direction D1. The second contact electrode CTE2 may contact the other end of the light emitting diode ED that is opposite to the end of the light emitting diode ED that the first contact electrode CTE1 contacts. The light emitting diode ED may be electrically connected to the second electrode CE through the second contact electrode CTE2.

Figure 6:
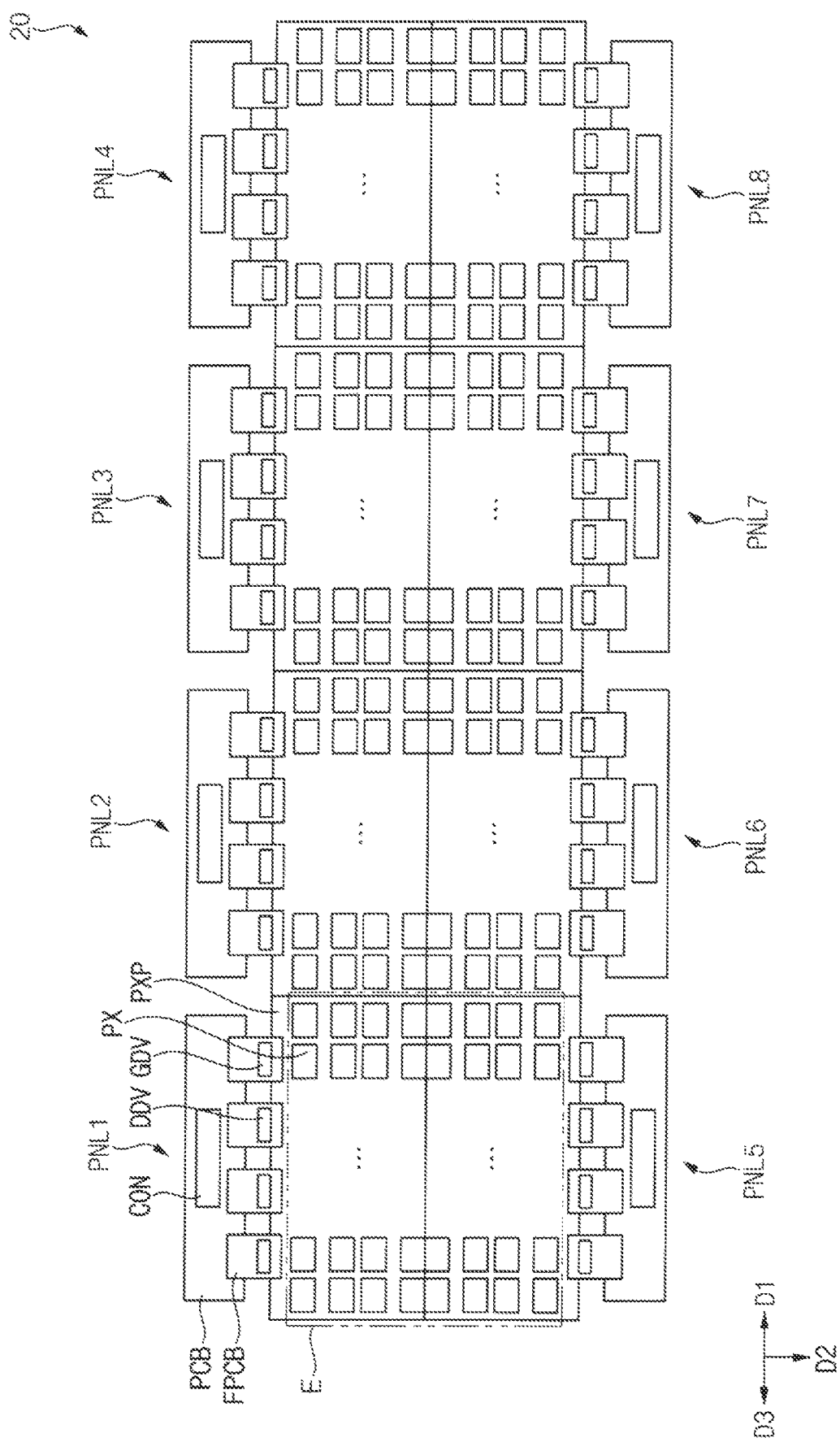
FIG. 6 is a plan view illustrating a tiling display device according to another embodiment.
Figure 7:
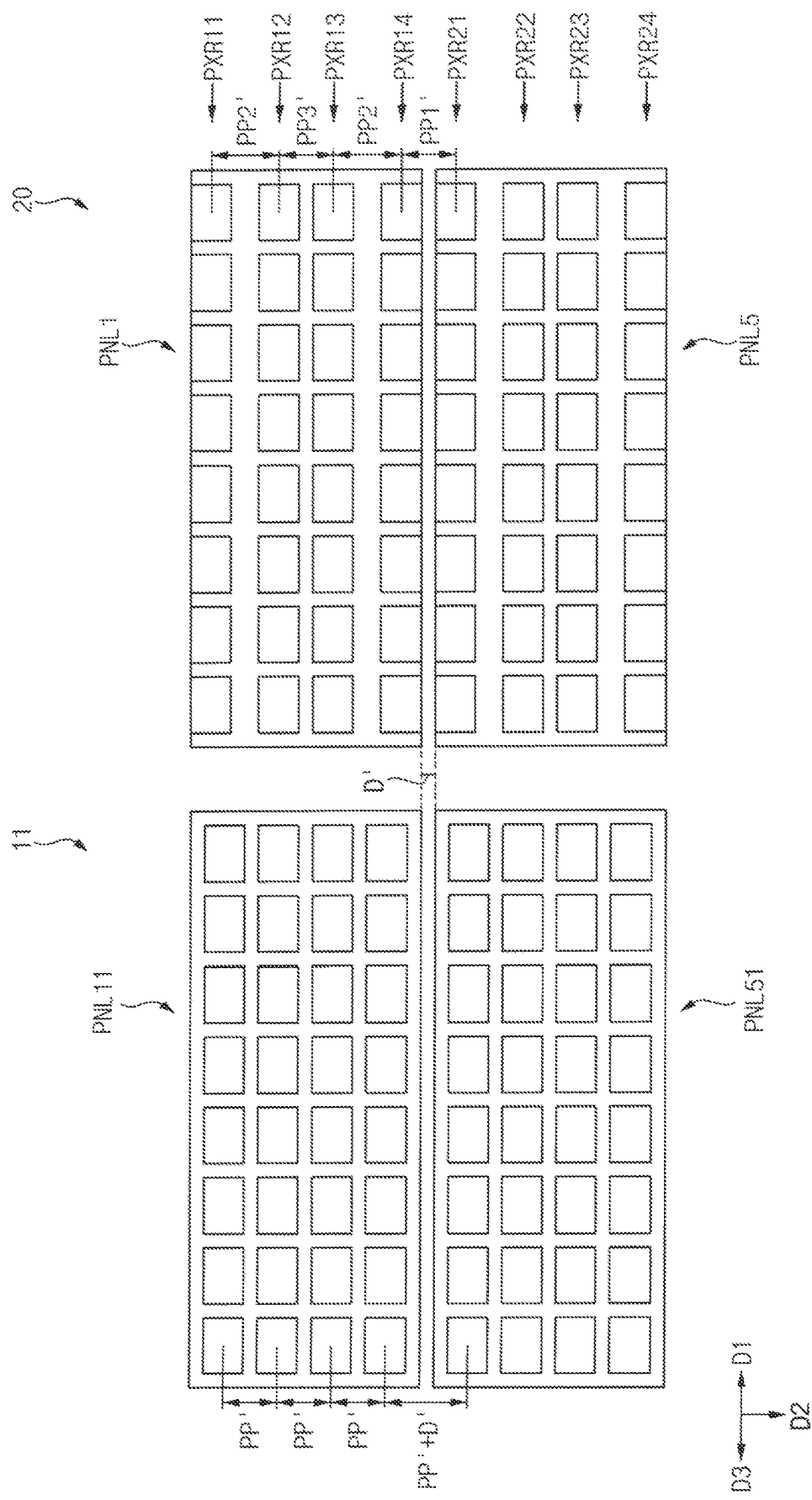
FIG. 7 is an enlarged view illustrating an arrangement structure of pixel columns according to the tiling display device of FIG. 6 and according to a comparative tiling display device.

FIG. 6 is a plan view illustrating a tiling display device according to another embodiment. FIG. 7 is an enlarged view illustrating an arrangement structure of pixel columns PXC according to the tiling display device of FIG. 6 and according to a comparative tiling display device. For example, FIG. 7 may be an enlarged view of area E of FIG. 6.

Referring to FIG. 6, a tiling display device 20 according to another embodiment of the present disclosure may include a plurality of display panels. The tiling display device 20 may include a first display panel PNL1, a second display panel PNL2, a third display panel PNL3, a fourth display panel PNL4, a fifth display panel PNL5, a sixth display panel PNL6, a seventh display panel PNL7, and an eighth display panel PNL8. The first to fourth display panels PNL1, PNL2, PNL3, and PNL4 may be arranged in a first row extending in a first direction D1, and the fifth to eighth display panels PNL5, PNL6, PNL7, and PNL8 may be arranged in a second row adjacent to the first row extending in the first direction D1. For example, the first direction D1 may be a horizontal direction, and a second direction D2 orthogonal to the first direction D2 may be a vertical direction.

The first display panel PNL1 may include a pixel portion PXP, at least one gate driver GDV, at least one data driver DDV, and a controller CON. However, the gate driver GDV, the data driver DDV, and the controller CON may be substantially the same as described in FIG. 1. In addition, the first to eighth display panels PNL1, PNL2, PNL3, PNL4, PNL5, PNL6, PNL7, and PNL8 may have substantially the same structure.

A plurality of pixels PX may be disposed in the pixel portion PXP. The pixels PX may be arranged in a matrix shape. In this case, the pixel portion PXP may include a plurality of pixel rows PXR that extends in the first direction D1 and is arranged in the second direction D2.

Referring to FIG. 7, the tiling display device 20 may include the first display panel PNL1 and the fifth display panel PNL5. The fifth display panel PNL5 may have a substantially the same structure as the first display panel PNL1, and may be spaced apart from the first display panel PNL1 by a vertical tiling interval D' in the second direction D2.

In an embodiment, the first display panel PNL1 may include a first pixel row PXR11, a second pixel row PXR12, a third pixel row PXR13, and a fourth pixel row PXR14 that extend in the first direction D1 and are arranged in the second direction D2. For example, the fourth pixel row PXR14 of the first display panel PNL1 may be adjacent to the fifth display panel PNL5. In addition, the fifth display panel PNL5 may include a first pixel row PXR21, a second pixel row PXR22, a third pixel row PXR23, and a fourth pixel row PXR24 that extend in the first direction D1 and are arranged in the second direction D2. For example, the first pixel row PXR21 of the fifth display panel PNL5 may be adjacent to the first display panel PNL1.

A comparative tiling display device 11 may include a first display panel PNL11 and a fifth display panel PNL51, and each of the first display panel PNL11 and the fifth display panel PNL51 may include a plurality of pixel rows. In the comparative tiling display device 11, a pixel distance PP' between adjacent pixel rows disposed on the first display panel PNL11 may be constant. In addition, the distance between the fourth pixel row of the first display panel PNL11 and the first pixel column of the fifth display panel PNL51 that are adjacent to each other may be equal to a sum of the pixel distance PP' and a vertical tiling interval D'.

On the other hand, in the tiling display device 20, the pixel distances between the first to fourth pixel rows PXR11, PXR12, PXR13, and PXR14 arranged in the first display panel PNL1 and the pixel distances between the first to fourth pixel rows PXR21, PXR22, PXR23, and PXR24 arranged in the fifth display panel PNL5 may be different from each other.

In an embodiment, the fourth pixel row PXR14 of the first display panel PNL1 may be shifted in the second direction D2 toward the fifth display panel PNL5 by half of the vertical tiling interval D'. In addition, the first pixel row PXR21 of the fifth display panel PNL5 may be shifted in a direction opposite to the second direction D2 toward the first display panel PNL1 by half of the vertical tiling interval D'. Accordingly, a first distance PP1' between the fourth pixel row PXR14 of the first display panel PNL1 and the first pixel row PXR21 of the fifth display panel PNL5 may be equal to the pixel distance PP'.

In an embodiment, a second distance PP2' between the third pixel row PXR13 and the fourth pixel row PXR14 of the first display panel PNL1 may be greater than the first distance PP1'. In addition, a third distance PP3' between the second pixel row PXR12 and the third pixel row PXR13 of the first display panel PNL1 may be less than the second distance PP2'. A distance between the first pixel row PXR11 and the second pixel row PXR12 may be the same as the second distance PP2'.

Figure 8:
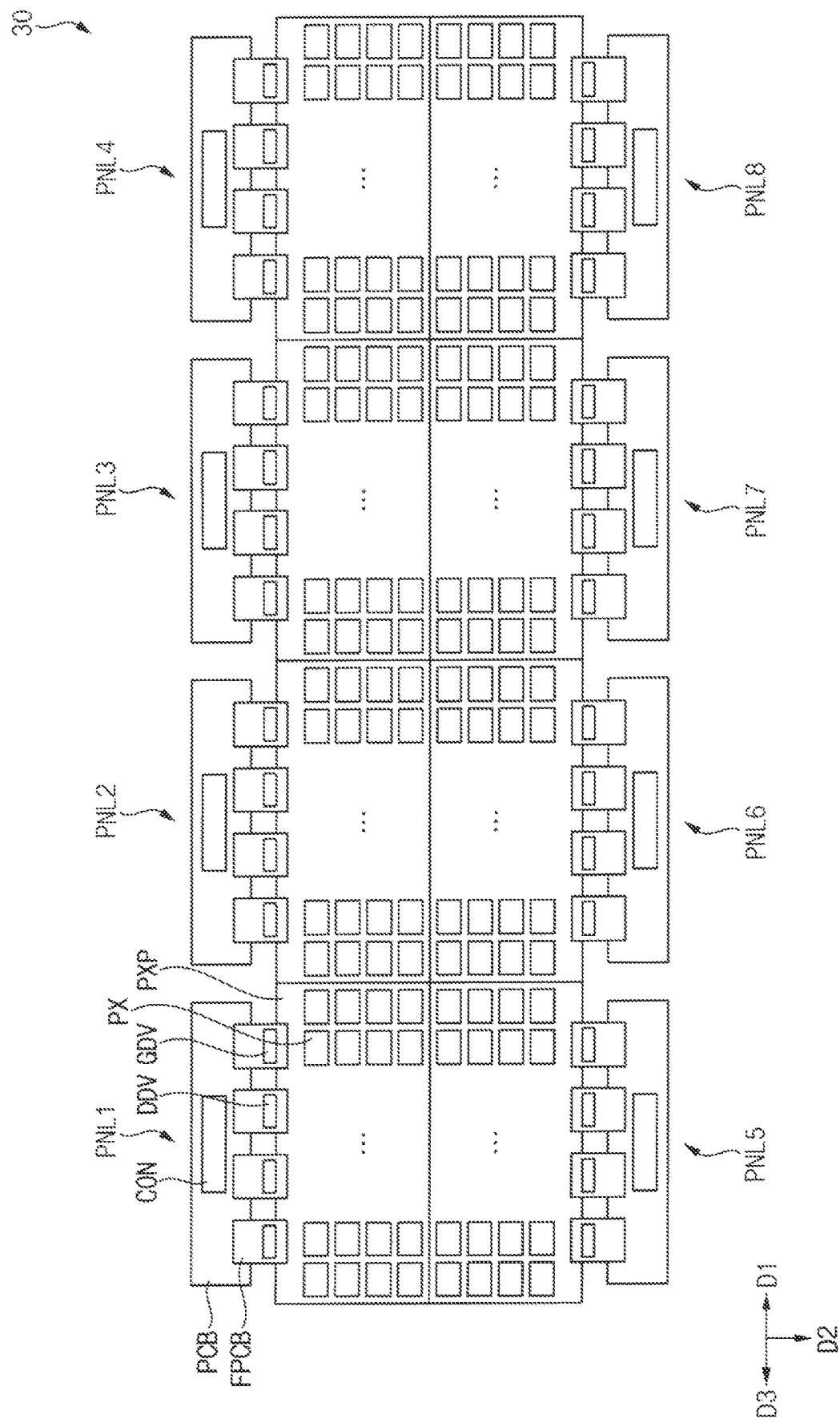
FIG. 8 is a plan view illustrating a tiling display device according to still another embodiment.
Figure 9:
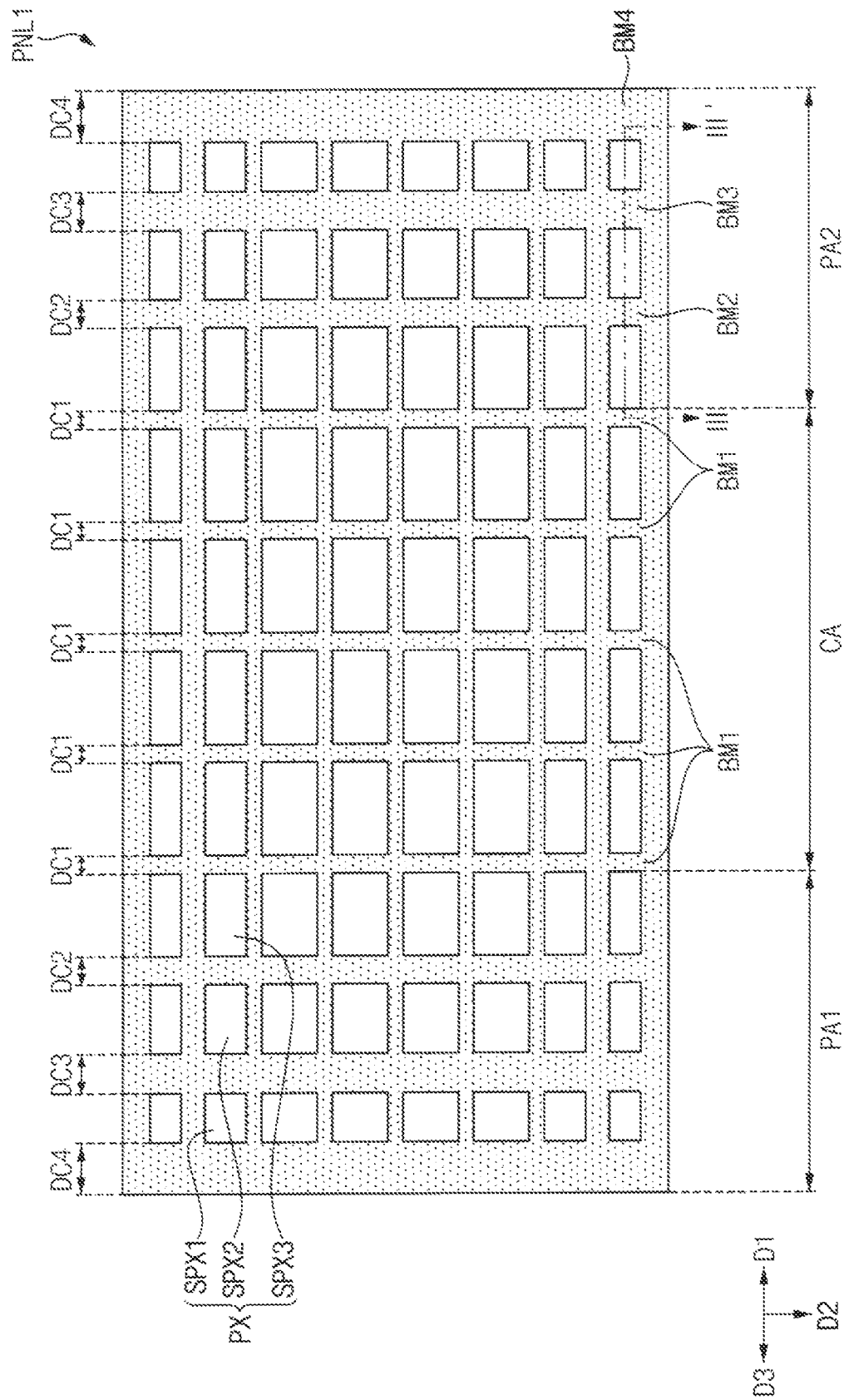
FIG. 9 is an enlarged view of the tiling display device of FIG. 8 according to one embodiment.
Figure 10:
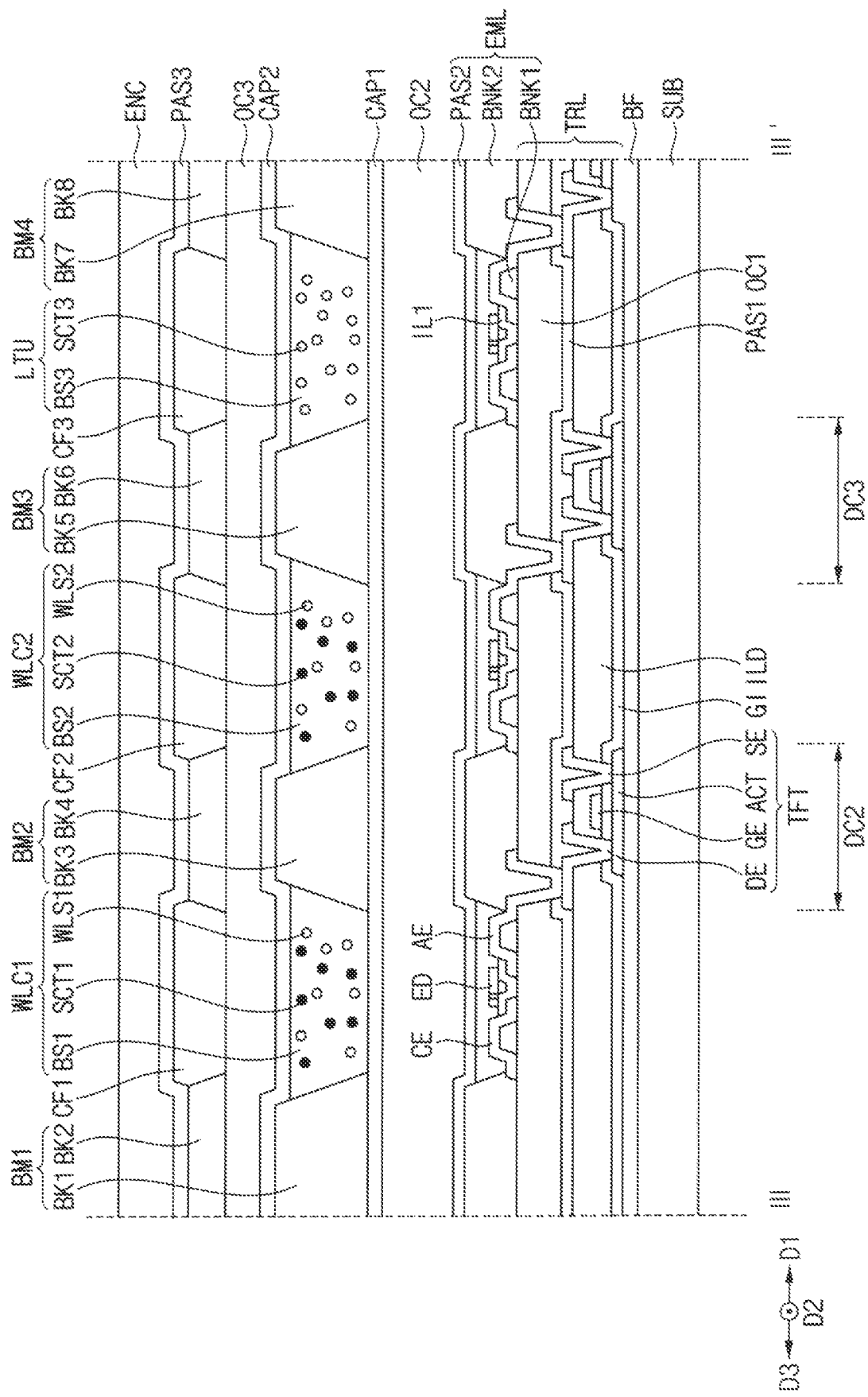
FIG. 10 is a cross-sectional view taken along line III-III' of FIG. 9.

FIG. 8 is a plan view illustrating a tiling display device according to still another embodiment. FIG. 9 is an enlarged view of the tiling display device of FIG. 8 according to one embodiment. FIG. 10 is a cross-sectional view taken along line III-III' of FIG. 9.

Referring to FIG. 8, a tiling display device 30 may include a plurality of display panels. For example, the tiling display device 30 may include first to eighth display panels PNL1, PNL2, PNL3, PNL4, PNL5, PNL6, PNL7, and PNL8. The first to fourth display panels PNL1, PNL2, PNL3, and PNL4 may be arranged in a first row extending in a first direction D1, and the fifth to eighth display panels PNL5, PNL6, PNL7, and PNL8 may be arranged in a second row adjacent to the first row extending in the first direction D1. For example, the first direction D1 may be a horizontal direction, and a second direction D2 orthogonal to the first direction D2 may be a vertical direction.

The first display panel PNL1 may include a pixel portion PXP, at least one gate driver GDV, at least one data driver DDV, and a controller CON. However, the gate driver GDV, the data driver DDV, and the controller CON may be substantially the same as described in FIG. 1. In addition, the first to eighth display panels PNL1, PNL2, PNL3, PNL4, PNL5, PNL6, PNL7, and PNL8 may have substantially the same structure.

A plurality of pixels PX may be disposed in the pixel portion PXP. The pixels PX may be arranged in a matrix shape. In addition, a black matrix pattern may be disposed in the pixel portion PXP.

Referring to FIG. 9, each of the pixels PX may include a plurality of sub-pixels. For example, each of the pixels PX may include first to third sub-pixels SPX1, SPX2, and SPX3. The first to third sub-pixels SPX1, SPX2, and SPX3 may emit red light, green light, and blue light, respectively.

The first display panel PNL1 may be divided into a first peripheral area PA1, a central area CA, and a second peripheral area PA2. The central area CA may correspond to an area between the first and second peripheral areas PA1 and PA2, and the second peripheral area PA2 may be adjacent to the second display panel PNL2. The first display panel PNL1 may have a structure symmetrical with respect to the central area CA.

In an embodiment, the first display panel PNL1 may include the sub-pixels disposed in a matrix shape and the black matrix pattern that is disposed between adjacent ones of the sub-pixels. In this case, the black matrix pattern may have a mesh structure.

In an embodiment, the first display panel PNL1 may include a first black matrix pattern BM1, a second black matrix pattern BM2, a third black matrix pattern BM3, and a fourth black matrix pattern BM4 that extend in the second direction D2 and are arranged in the first direction D1. For example, the first black matrix pattern BM1 may be disposed in the central area CA, and the second to fourth black matrix patterns BM2, BM3, and BM4 may be disposed in the second peripheral area PA2. In particular, the fourth black matrix pattern BM4 may be adjacent to the second display panel PNL2.

In an embodiment, a first width DC1, a second width DC2, a third width DC3, and a fourth width DC4 in the first direction D1 corresponding to the first to fourth black matrix patterns BM1, BM2, BM3, and BM4 may be different from each other. For example, the first to fourth widths DC1, DC2, DC3, and DC4 may gradually increase from the central area CA to the first peripheral area PA1, and may gradually increase from the central area CA to the second peripheral area PA2.

For example, the fourth width DC4 of the fourth black matrix pattern BM4 may be greater than the third width DC3 of the third black matrix pattern BM3. The third width DC3 may be greater than the second width DC2 of the second black matrix pattern BM2. The second width DC2 may be greater than the first width DC1 of the first black matrix pattern BM1.

The tiling display device 30 may include a plurality of display panels (e.g., the first to eighth display panels PNL1 to PNL8), and each of the display panels may be divided into a central area CA and a peripheral area PA (e.g., PA1 or PA2) adjacent to a neighboring display panel in the first direction D1. Each of the display panels may include a plurality of black matrix patterns (e.g., the first to fourth black matrix patterns BM1, BM2, BM3, and BM4) extending in the second direction D2, and widths of the black matrix patterns may gradually increase from the central area CA to the peripheral area PA. Accordingly, emission areas of the pixels PX may decrease toward a boundary area between adjacent ones of the display panels, and the boundary area between the display panels may be visually unrecognizable.

Referring to FIG. 10, a substrate SUB may include a transparent or an opaque material. For example, the substrate SUB may include glass, quartz, plastic, or the like.

A buffer layer BF may be disposed on the substrate SUB. The buffer layer BF may be formed of an inorganic film capable of preventing penetration of air or moisture.

A transistor layer TRL may be disposed on the substrate SUB. At least one transistor TFT may be formed in the transistor layer TRL. The transistors TFT formed in the transistor layer TRL may include a switching transistor that is turned on in response to the gate signal, a driving transistor that generates a driving current based on the data voltage, and a light emitting transistor that transfers the driving current to a light emitting element.

A semiconductor layer ACT may be disposed on the buffer layer BF, and a gate insulating layer GI may be disposed on the semiconductor layer ACT and the buffer layer BF. The semiconductor layer ACT may overlap a gate electrode GE, a source electrode SE, and a drain electrode DE. The semiconductor layer ACT may directly contact the source electrode SE and the drain electrode DE, and may face the gate electrode GE with the gate insulating layer GI interposed therebetween. The TFT may include the semiconductor layer ACT, the gate electrode GE, the source electrode SE, and the drain electrode DE.

The gate electrode GE may be disposed on the gate insulating layer GI. The gate electrode GE may overlap the semiconductor layer ACT with the gate insulating layer GI interposed therebetween.

An interlayer insulating layer ILD may be disposed on the gate insulating layer GI and the gate electrode GE. The source electrode SE and the drain electrode DE may be disposed to be spaced apart from each other on the interlayer insulating layer ILD. The source electrode SE may contact one end of the semiconductor layer ACT through a contact hole that penetrates through the gate insulating layer GI and the interlayer insulating layer ILD. The drain electrode DE may contact the other end of the semiconductor layer ACT through another contact hole that penetrates through the gate insulating layer GI and the interlayer insulating layer ILD. The drain electrode DE may be connected to a first electrode AE of a light emitting member EL through a contact hole that penetrates through a first passivation layer PAS1 and a first planarization layer OC1 that are disposed on the interlayer insulating layer ILD.

The gate insulating layer GI that is disposed on the semiconductor layer ACT and the buffer layer BF may provide insulation between semiconductor layer ACT and the gate electrode GE. The gate insulating layer GI may include a first contact hole through which the source electrode SE passes and another contact hole through which the drain electrode DE passes.

The interlayer insulating layer ILD that is disposed on the gate electrode GE may include a contact hole through which the source electrode SE passes and another contact hole through which the drain electrode DE passes.

The first passivation layer PAS1 may be disposed on the transistor TFT and may protect the transistor TFT. For example, the first passivation layer PAS1 may include a contact hole through which the first electrode AE passes.

The first planarization layer OC1 may be disposed on the first passivation layer PAS1 and may planarize an upper surface of the transistor TFT. For example, the first planarization layer OC1 may include a contact hole through which the first electrode AE of the light emitting member EL passes.

A light emitting diode layer EML may include the light emitting member EL, a first bank BNK1, a second bank BNK2, and a second passivation layer PAS2.

The light emitting member EL may be disposed on the transistor TFT. The light emitting member EL may include the first electrode AE, a second electrode CE, and a light emitting diode ED.

The first electrode AE may be disposed on the first planarization layer OC1. For example, the first electrode AE may be disposed on one first bank BNK1 that is disposed on the first planarization layer OC1 and may cover the first bank BNK1. The first electrode AE may be connected to the drain electrode DE of the transistor TFT.

The second electrode CE may be disposed on the first planarization layer OC1. For example, the second electrode CE may be disposed on an adjacent first bank BNK1 that is disposed on the first planarization layer OC1 adjacent to the first bank BNK1 on which the first electrode AE is disposed, and may cover the first bank BNK1. The second electrode CE may receive a common voltage supplied to the plurality of pixels PX.

A first insulating layer IL1 may cover a portion of the first electrode AE and a portion of the second electrode CE that are adjacent to each other, and may insulate between the first electrode AE and the second electrode CE.

The light emitting diode ED may be disposed between the first electrode AE and the second electrode CE on the first insulating layer ILL One end of the light emitting diode ED may be connected to the first electrode AE, and the other end of the light emitting diode ED may be connected to the second electrode CE. For example, each of the light emitting diode ED of the plurality of pixels PX may include an active layer having the same material and may emit light of the same wavelength band or light of the same color. For example, the light emitting diode ED may emit blue light having a peak wavelength in the range of about 440 nm to about 480 nm.

The second bank BNK2 may be disposed on the first planarization layer OC1 to define a light emitting area. For example, the second bank BNK2 may surround the light emission area, but the present disclosure is not limited thereto.

The second passivation layer PAS2 may be disposed on the light emitting member EL and the second bank BNK2. The second protective layer PAS2 may cover the light emitting member EL and may protect the light emitting member EL.

A second planarization layer OC2 may be disposed on the light emitting diode layer EML to planarize an upper surface of the light emitting diode layer EML. The second planarization layer OC2 may include an organic material.

A first capping layer CAP1 may be disposed on the second planarization layer OC2. The first capping layer CAP1 may seal lower surfaces of a first wavelength converter WLC1 and a second wavelength converter WLC2 that are disposed on the first capping layer CAP1. The first capping layer CAP1 may include an inorganic material.

A first light blocking member BK1, a third light blocking member BK3, a fifth light blocking member BK5, and a seventh light blocking member BK7 may be disposed on the first capping layer CAP1. The first, third, fifth, and seventh light blocking members BK1, BK3, BK5, and BK7 may overlap the second bank BNK2 in a thickness direction of the tiling display device 30. The first, third, fifth, and seventh light blocking members BK1, BK3, BK5, and BK7 may block light. The first, third, fifth, and seventh light blocking members BK1, BK3, BK5, and BK7 may include an organic light blocking material and a liquid repellent component.

The first wavelength converter WLC1 may be disposed on the first capping layer CAP1. The first wavelength converter WLC1 may overlap a corresponding one of the light emitting diodes ED. The first wavelength converter WLC1 may be surrounded by the first light blocking member BK1. The first wavelength converter WLC1 may include a first base resin BS1, a first scattering body SCT1, and a first wavelength shifter WLS1.

The first base resin BS1 may include a material having a relatively high light transmittance. The first base resin BS1 may be made of a transparent organic material. For example, the first base resin BS1 may include at least one of organic materials such as an epoxy resin, an acrylic resin, a cardo resin, and an imide resin.

The first scattering body SCT1 may have a refractive index that is different from a refractive index of the first base resin BS1, and may form an optical interface with the first base resin BS1. For example, the first scattering body SCT1 may include a light scattering material or light scattering particles that scatter at least a portion of the transmitted light.

The first wavelength shifter WLS1 may convert or shift a peak wavelength of incident light to a first peak wavelength. For example, the first wavelength shifter WLS1 may convert blue light into green light having a peak wavelength in the range of about 510 nm to about 550 nm. In one embodiment, the first wavelength shifter WLS1 may be a quantum dot, a quantum rod, a phosphor, or any combination thereof. The quantum dot may be a particulate material that emits a specific color while electrons transition from a conduction band to a valence band.

The light emitted by the first wavelength shifter WLS1 may have a full width (e.g., full width of half maximum, FWHM) of an emission wavelength spectrum of about 45 nm or less, or about 40 nm or less, or about 30 nm or less. Accordingly, color reproducibility of the tiling display device 30 may be improved.

Some of the blue light emitted from the light emitting diode layer EML may pass through the first wavelength converter WLC1 without being converted into green light by the first wavelength shifter WLS1. Among the blue light emitted from the light emitting diode layer EML, the light that is not converted by the first wavelength converter WLC1 and incident on a first color filter CF1 may be filtered by the first color filter CF1. In addition, the green light converted by the first wavelength converter WLC1 may pass through the first color filter CF1 and be emitted to the outside.

The second wavelength converter WLC2 may be disposed on the first capping layer CAP1 adjacent to the first wavelength converter WLC1. The second wavelength converter WLC2 may overlap a corresponding one of the light emitting diodes ED. The second wavelength converter WLC2 may be surrounded by the first light blocking member BK1. The second wavelength converter WLC2 may include a second base resin BS2, a second scattering body SCT2, and a second wavelength shifter WLS2.

The second base resin BS2 may include a material having a relatively high light transmittance. The second base resin BS2 may be made of a transparent organic material. For example, the second base resin BS2 may include at least one of organic materials such as an epoxy resin, an acrylic resin, a cardo resin, and an imide resin.

The second scattering body SCT2 may have a refractive index that is different from a refractive index of the second base resin BS2, and may form an optical interface with the second base resin BS2. For example, the second scattering body SCT2 may include a light scattering material or light scattering particles that scatter at least a portion of the transmitted light.

The second wavelength shifter WLS2 may convert or shift the peak wavelength of incident light into a second peak wavelength that is different from the first peak wavelength of the first wavelength shifter WLS1. For example, the second wavelength shifter WLS2 may convert blue light into red light having a peak wavelength in the range of about 610 nm to 650 nm. In one embodiment, the second wavelength shifter WLS2 may be a quantum dot, a quantum rod, a phosphor, or any combination thereof. The second wavelength shifter WLS2 may include a material having the same effect as the material of the first wavelength shifter WLS1.

A light transmitting part LTU may be further disposed on the first capping layer CAP1. The light transmitting part LTU may overlap a corresponding one of the light emitting diodes ED. The light transmitting part LTU may be surrounded by the first light blocking member BK1. The light transmitting part LTU may transmit the incident light by maintaining its peak wavelength. The light transmitting part LTU may include a third base resin and a third scattering body.

The third base resin BS3 may include a material having a relatively high light transmittance. The third base resin BS3 may be made of a transparent organic material.

The third scattering body SCT3 may have a refractive index that is different from a refractive index of the third base resin BS3, and may form an optical interface with the third base resin BS3. For example, the third scattering body SCT3 may include a light scattering material or light scattering particles that scatter at least a portion of the transmitted light.

The first and second wavelength converters WLC1 and WLC2 and the light transmitting part LTU may be disposed on the light emitting diode layer EML with the second planarization layer OC2 and the first capping layer CAP1 interposed therebetween. Accordingly, the tiling display device 30 may not require a separate substrate for the first and second wavelength converters WLC1 and WLC2 and the light transmitting part LTU.

The second capping layer CAP2 may cover the first and second wavelength converters WLC1 and WLC2, the light transmitting part LTU, and the first light blocking member BK1.

The third planarization layer OC3 may be disposed on the second capping layer CAP2 to planarize upper surfaces of the first and second wavelength converters WLC1 and WLC2 and the light transmitting part LTU. The third planarization layer OC3 may include an organic material.

A second light blocking member BK2, a fourth light blocking member BK4, a sixth light blocking member BK6, and an eighth light blocking member BK8 may be disposed on the third planarization layer OC3. The second, fourth, sixth and eighth light blocking members BK2, BK4, BK6, and BK8 may respectively overlap the first, third, fifth, and seventh light blocking members BK1, BK3, BK5, and BK7 in the thickness direction of the tiling display device 30. The second, fourth, sixth, and eighth light blocking members BK2, BK4, BK6, and BK8 may block light.

The first color filter CF1 may be disposed on the third planarization layer OC3. The first color filter CF1 may be surrounded by the second light blocking member BK2. The first color filter CF1 may overlap the first wavelength converter WLC1 in the thickness direction of the tiling display device 30. The first color filter CF1 may selectively transmit light of a first color (e.g., green light), and may block or absorb light of the second color (e.g., red light) and light of a third color (e.g., blue light).

A second color filter CF2 may be disposed on the third planarization layer OC3. The second color filter CF2 may be surrounded by the second light blocking member BK2. The second color filter CF2 may overlap the second wavelength converter WLC2 in the thickness direction of the tiling display device 30. The second color filter CF2 may selectively transmit light of the second color (e.g., red light), and may block or absorb light of the first color (e.g., green light) and light of the third color (e.g., blue light).

A third color filter CF3 may be disposed on the third planarization layer OC3. The third color filter CF3 may be surrounded by the second light blocking member BK2. The third color filter CF3 may overlap the light transmitting part LTU in the thickness direction of the tiling display device 30. The third color filter CF3 may selectively transmit light of the third color (e.g., blue light), and may block or absorb light of the first color (e.g., green light) and light of the second color (e.g., red light).

A third passivation layer PAS3 may cover the first color filter CF1, the second color filter CF2, and the third color filter CF3. The third passivation layer PAS3 may protect the first color filter CF1, the second color filter CF2, and the third color filter CF3.

An encapsulation layer ENC may be disposed on the third passivation layer PAS3. For example, the encapsulation layer ENC may include at least one inorganic layer to prevent penetration of oxygen or moisture. In addition, the encapsulation layer ENC may include at least one organic layer.

The first black matrix pattern BM1 may include the first and second light blocking members BK1 and BK2. The second black matrix pattern BM2 may include the third and fourth light blocking members BK3 and BK4. The third black matrix pattern BM3 may include the fifth and sixth light blocking members BK5 and BK6. The fourth black matrix pattern BM4 may include the seventh and eighth light blocking members BK7 and BK8.

As described above, the first width DC1 of the first black matrix pattern BM1 may be less than the second width DC2 of the second black matrix pattern BM2, the second width DC2 may be less than the third width DC3 of the third black matrix pattern BM3, and the third width DC3 may be less than the fourth width DC4 of the fourth black matrix pattern BM4.

Figure 11:
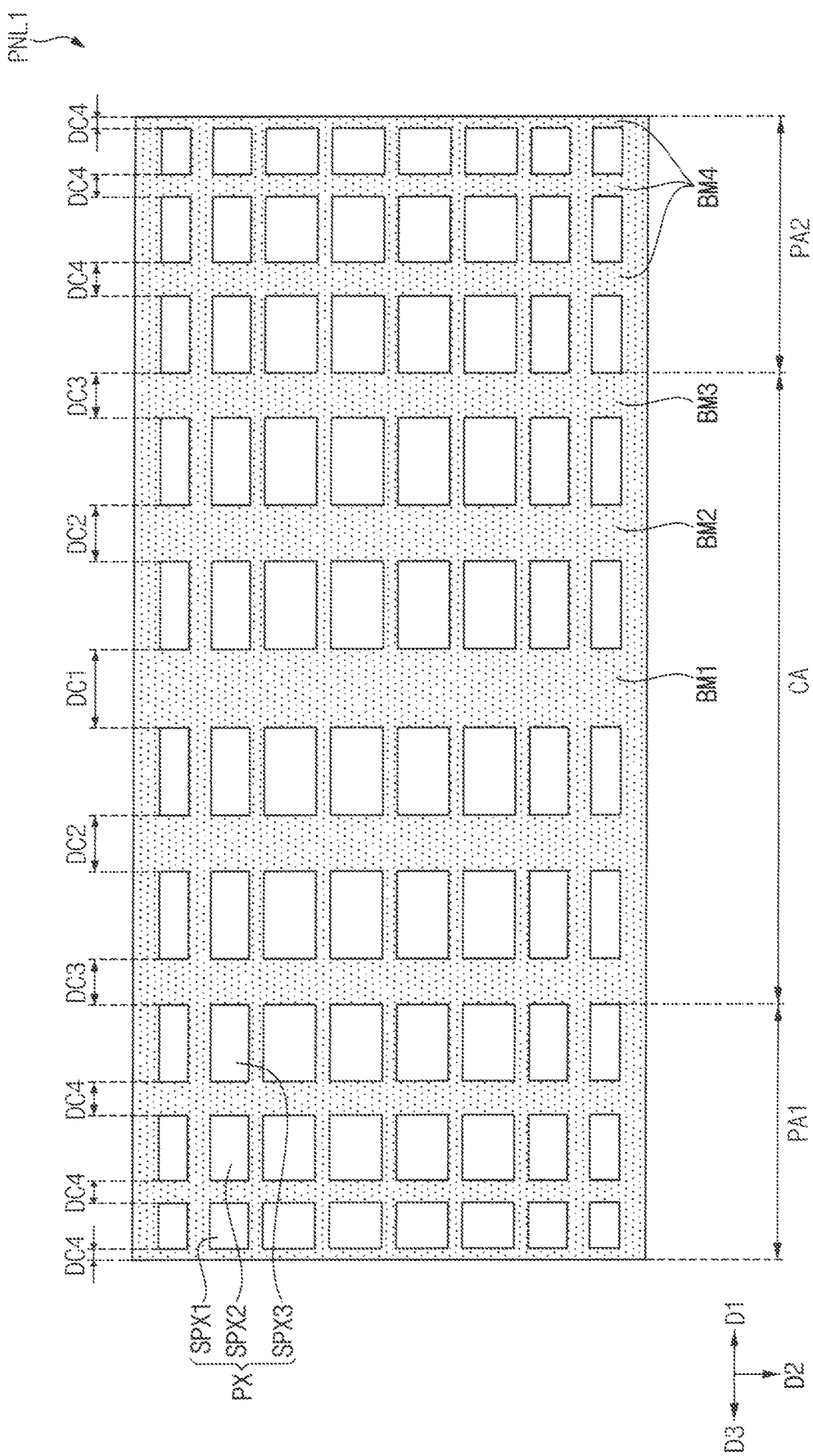
FIG. 11 is an enlarged view of the tiling display device of FIG. 8 according to another embodiment.

FIG. 11 is an enlarged view of the tiling display device 30 of FIG. 8 according to another embodiment.

Referring to FIG. 11, each of the pixels PX may include a plurality of sub-pixels. For example, each of the pixels PX may include first to third sub-pixels SPX1, SPX2, and SPX3. The first to third sub-pixels SPX1, SPX2, and SPX3 may emit red light, green light, and blue light, respectively.

The first display panel PNL1 may be divided into a first peripheral area PA1, a central area CA, and a second peripheral area PA2. The central area CA may correspond to an area between the first and second peripheral areas PA1 and PA2, and the second peripheral area PA2 may be adjacent to the second display panel PNL2. The first display panel PNL1 may have a structure symmetrical with respect to the central area CA.

In an embodiment, the first display panel PNL1 may include the sub-pixels disposed in a matrix shape and the black matrix pattern that is disposed between adjacent ones of the sub-pixels. In this case, the black matrix pattern may have a mesh structure.

In an embodiment, the first display panel PNL1 may include a first black matrix pattern BM1, a second black matrix pattern BM2, a third black matrix pattern BM3, and a fourth black matrix pattern BM4 that extend in the second direction D2 and are arranged in the first direction D1. For example, the first black matrix pattern BM1, the second black matrix pattern BM2, and the third black matrix pattern BM3 may be disposed in the central area CA, and the fourth black matrix pattern BM4 may be disposed in the second peripheral area PA2. In particular, the fourth black matrix pattern BM4 may be adjacent to the second display panel PNL2.

In an embodiment, a first width DC1, a second width DC2, a third width DC3, a fourth width DC4 in the first direction D1 corresponding to the first to fourth black matrix patterns BM1, BM2, BM3, and BM4 may be different from each other. For example, the first to fourth widths DC1, DC2, DC3, and DC4 may gradually decrease from the central area CA to the first peripheral area PA1, and may gradually decrease from the central area CA to the second peripheral area PA2.

For example, the fourth width DC4 of the fourth black matrix pattern BM4 may be less than the third width DC3 of the third black matrix pattern BM3. The third width DC3 may be less than the second width DC2 of the second black matrix pattern BM2. The second width DC2 may be less than the first width DC1 of the first black matrix pattern BM1.

The tiling display device 30 may include a plurality of display panels (e.g., the first to eighth display panels PNL1 to PNL8), and each of the display panels may be divided into a central area CA and a peripheral area PA (e.g., PA1 or PA2) adjacent to a neighboring display panel in the first direction D1. Each of the display panels may include a plurality of black matrix patterns (e.g., the first to fourth black matrix patterns BM1, BM2, BM3, and BM4) extending in the second direction D2, and widths of the black matrix patterns may gradually decrease from the central area CA to the peripheral area PA. Accordingly, emission areas of the pixels PX may decrease toward a boundary area between adjacent ones of the display panels, and the boundary area between the display panels may be visually unrecognizable.

Although certain embodiments and implementations of the present disclosure have been described herein, other embodiments and modifications will be apparent from this description. Accordingly, the inventive concepts of the present disclosure are not limited to such disclosed embodiments, but rather to a broader scope of the present disclosure including the appended claims and various obvious modifications and equivalent arrangements thereof as would be apparent to a person of ordinary skill in the art.

What is claimed is:

1. A tiling display device comprising:
   a first display panel including a first set of pixel columns that extends in a vertical direction and is arranged in a horizontal direction, wherein the first set of pixel columns includes first to (n)-th (where n is an integer greater than 1) pixel columns; and
   a second display panel spaced apart from the first display panel by a horizontal tiling interval and including a second set of pixel columns that extends in the vertical direction and is arranged in the horizontal direction, wherein the second set of pixel columns includes first to (m)-th (where m is an integer greater than 1) pixel columns,
   wherein the (n)-th pixel column of the first display panel is disposed adjacent to the first pixel column of the second display panel, and
   wherein a first distance between the (n)-th pixel column of the first display panel and the first pixel column of the second display panel is less than a second distance between a (n−1)-th pixel column of the first display panel and the (n)-th pixel column of the first display panel.

2. The tiling display device of claim 1, wherein the (n)-th pixel column of the first display panel is shifted in the horizontal direction toward the second display panel by a half of the horizontal tiling interval.

3. The tiling display device of claim 2, wherein the first pixel column of the second display panel is shifted in the horizontal direction toward the first display panel by half of the horizontal tiling interval.

4. The tiling display device of claim 1, wherein a third distance between adjacent ones of pixel columns among the first set of pixel columns that are arranged in a central area of the first display panel is less than or equal to the first distance between the (n)-th pixel column of the first display panel and the first pixel column of the second display panel.

5. The tiling display device of claim 1, wherein the second distance between the (n−1)-th pixel column and the (n)-th pixel column of the first display panel is less than a fourth distance between the (n−1)-th pixel column and (n−2)-th pixel column of the first display panel.

6. The tiling display device of claim 1, wherein the first display panel is divided into a first central area, a first peripheral area adjacent to the second display panel, and a first intermediate area between the first central area and the first peripheral area, and
wherein the first distance between the (n)-th pixel column of the first display panel and the first pixel column of the second display panel is less than a fifth distance between adjacent ones of pixel columns among the first set of pixel columns that are arranged in the first intermediate area of the first display panel.

7. The tiling display device of claim 6, wherein a sixth distance between adjacent ones of pixel columns among the first set of pixel columns that are arranged in the first central area of the first display panel is less than the fifth distance.

8. The tiling display device of claim 6, each of distances between adjacent ones of the first set of pixel columns of the first display panel gradually decreases from the first intermediate area to the first central area.

9. The tiling display device of claim 6, wherein each of distances between adjacent ones of the first set of pixel columns of the first display panel gradually decreases from the first intermediate area to the first peripheral area.

10. The tiling display device of claim 6, wherein the second display panel is divided into a second central area, a second peripheral area adjacent to the first display panel, and a second intermediate area between the second central area and the second peripheral area, and
wherein the first distance between the (n)-th pixel column of the first display panel and the first pixel column of the second display panel is less than a seventh distance between adjacent ones of pixel columns among the second set of pixel columns that are arranged in the second intermediate area.

11. The tiling display device of claim 10, wherein an eighth distance between adjacent ones of pixel columns among the second set of pixel columns that are arranged in the second central area of the second display panel is less than the seventh distance.

12. The tiling display device of claim 10, each of distances between adjacent ones of the second set of pixel columns of the second display panel gradually decreases from the second intermediate area to the second central area.

13. The tiling display device of claim 10, wherein each of distances between adjacent ones of the second set of pixel columns of the second display panel gradually decreases from the second intermediate area to the second peripheral area.

14. The tiling display device of claim 1, wherein the first display panel further includes:
a first data driver disposed on a side of the first display panel and providing a data voltage to the first set of pixel columns; and
a first gate driver disposed on the side of the first display panel and providing a gate signal to the first set of pixel columns.

15. The tiling display device of 14, wherein the second display panel further includes:
a second data driver disposed on a side of the second display panel and providing a data voltage to the second set of pixel columns; and
a second gate driver disposed on the side of the second display panel and providing a gate signal to the second set of pixel columns.

16. A tiling display device comprising:
a first display panel including a first set of pixel rows that extends in a horizontal direction and is arranged in a vertical direction, wherein the first set of pixel rows includes first to (n)-th (where n is an integer greater than 1) pixel rows; and
a second display panel spaced apart from the first display panel by a vertical tiling interval and including a second set of pixel rows that extends in the horizontal direction and is arranged in the vertical direction, wherein the second set of pixel rows includes first to (m)-th (where m is an integer greater than 1) pixel rows,
wherein the (n)-th pixel row of the first display panel is disposed adjacent to the first pixel row of the second display panel, and
wherein a first distance between the (n)-th pixel row of the first display panel and the first pixel row of the second display panel is less than a second distance between a (n−1)-th pixel row of the first display panel and the (n)-th pixel row of the first display panel.

17. The tiling display device of claim 16, wherein the (n)-th pixel row of the first display panel is shifted in the vertical direction toward the second display panel by half of the vertical tiling interval.

18. The tiling display device of claim 17, wherein the first pixel row of the second display panel is shifted in the vertical direction toward the first display panel by half of the vertical tiling interval.

19. A tiling display device comprising:
a first display panel including a plurality of first black matrix patterns, wherein each of the plurality of first black matrix patterns extends in a vertical direction and is arranged in a horizontal direction; and
a second display panel including a plurality of second black matrix patterns, wherein each of the plurality of second black matrix patterns extends in the vertical direction and is arranged in the horizontal direction,
wherein the first display panel is divided into a central area and a peripheral area that is between the central area of the first display panel and the second display panel, and
wherein a first width of each of the plurality of first black matrix patterns in the peripheral area in the horizontal direction is greater than a second width of each of the plurality of first black matrix patterns in the central area in the horizontal direction.

20. The tiling display device of claim 19, each of widths of the plurality of first black matrix patterns of the first display panel in the horizontal direction gradually increases from the central area to the peripheral area.

* * * * *